(12) United States Patent
Lin et al.

(10) Patent No.: US 12,132,143 B2
(45) Date of Patent: Oct. 29, 2024

(54) LIGHT EMITTING DEVICE

(71) Applicant: InnoLux Corporation, Miao-Li County (TW)

(72) Inventors: Hsiao-Lang Lin, Miao-Li County (TW); Tsung-Han Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/126,487

(22) Filed: Mar. 27, 2023

(65) Prior Publication Data

US 2023/0253525 A1 Aug. 10, 2023

Related U.S. Application Data

(63) Continuation of application No. 16/916,165, filed on Jun. 30, 2020, now Pat. No. 11,637,217.

(30) Foreign Application Priority Data

Jul. 23, 2019 (CN) .......................... 201910668584.2

(51) Int. Cl.
  *H01L 33/00* (2010.01)
  *H01L 25/075* (2006.01)
  *H01L 33/50* (2010.01)

(52) U.S. Cl.
  CPC ...... *H01L 33/0095* (2013.01); *H01L 25/0753* (2013.01); *H01L 33/502* (2013.01); *H01L 2933/0041* (2013.01)

(58) Field of Classification Search
  CPC ............ H01L 51/5256; H01L 51/5268; H01L 2251/5369; H01L 2251/558; H01L 27/322
  See application file for complete search history.

(56) References Cited

U.S. PATENT DOCUMENTS

| 10,312,228 | B2 | 6/2019 | Chen | |
|---|---|---|---|---|
| 2014/0029080 | A1* | 1/2014 | Hwang | G02B 26/005 359/290 |
| 2015/0001486 | A1* | 1/2015 | Kim | H10K 59/122 438/23 |
| 2018/0182989 | A1* | 6/2018 | Paek | G09F 9/30 |
| 2018/0210280 | A1 | 7/2018 | Chen | |
| 2019/0189969 | A1* | 6/2019 | Youn | H10K 59/88 |
| 2021/0005672 | A1* | 1/2021 | Lee | H10K 50/865 |
| 2021/0305225 | A1* | 9/2021 | Kim | H01L 25/167 |

FOREIGN PATENT DOCUMENTS

| CN | 106526962 A | 3/2017 |
|---|---|---|
| CN | 108345142 A | 7/2018 |

* cited by examiner

*Primary Examiner* — Ratisha Mehta
(74) *Attorney, Agent, or Firm* — Winston Hsu

(57) ABSTRACT

The present disclosure provides a light emitting device including a substrate, a plurality of light emitting elements disposed on the substrate, a partition wall disposed on the substrate, a light conversion element, an encapsulation layer disposed on the light emitting element, an intermediate layer disposed between the light conversion element and one of the light emitting elements, and a protection layer disposed between the intermediate layer and the light emitting elements. The partition wall defines a plurality of cavities, and one of the cavities corresponds to one of the light emitting elements. The light conversion element is disposed in the one of the cavities.

16 Claims, 16 Drawing Sheets

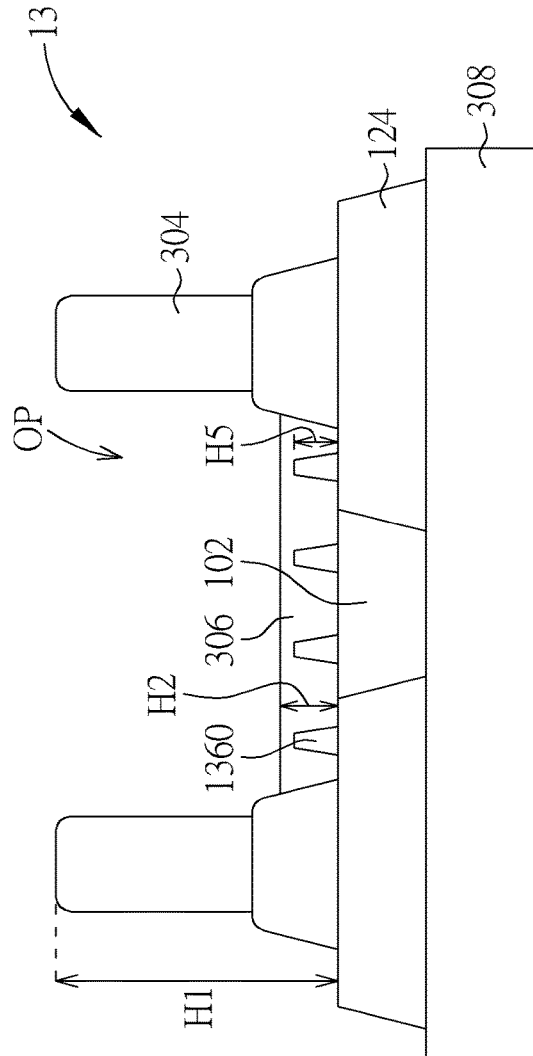
FIG. 13
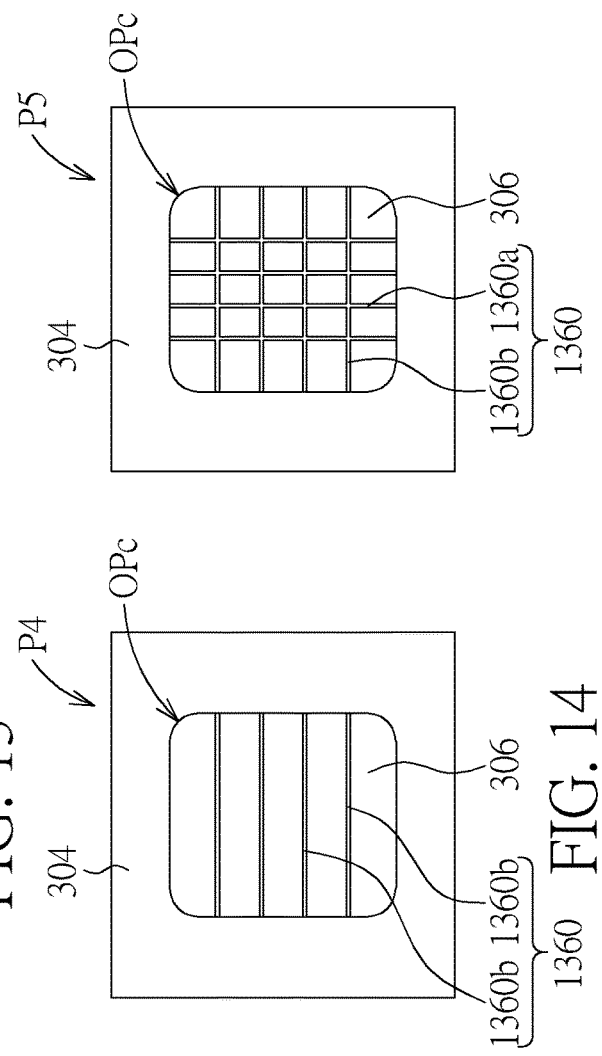
FIG. 14
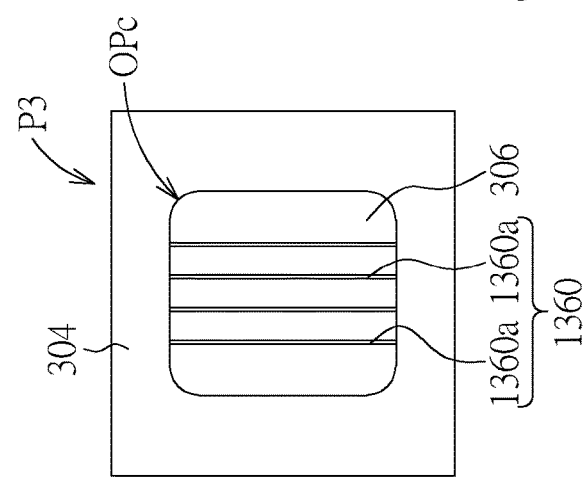

LIGHT EMITTING DEVICE

CROSS REFERENCE TO RELATED APPLICATIONS

This application is a continuation application of U.S. application Ser. No. 16/916,165, filed on Jun. 30, 2020. The content of the application is incorporated herein by reference.

BACKGROUND OF THE DISCLOSURE

1. Field of the Disclosure

The present disclosure relates to a light emitting device and more particularly to a light emitting device including a high partition wall.

2. Description of the Prior Art

Because the quantum dot materials can convert the light emitted from the light emitting element to the light with the required color, in order to increase the color saturation of the display device to improve the quality of display, the manufacturers in the related fields propose a plan for applying the quantum dot materials to the display device.

The present method of manufacturing the light conversion element including quantum dot material is to inject the solution containing quantum dots into the opening of the black matrix through inkjet printing technique, and the solution is then dried to form the required light conversion element through baking. However, because the thickness of the present black matrix is excessively low, the solution injected into a single opening may easily overflow to the adjacent opening. Thus, the quantum dots overflowed to the adjacent opening would be mixed with the solution in the adjacent opening, such that the light generated from the adjacent opening has a problem of color mixing.

SUMMARY OF THE DISCLOSURE

According an embodiment of the present disclosure, a light emitting device is provided. The light emitting device includes a substrate, a plurality of light emitting elements disposed on the substrate, a partition wall disposed on the substrate, a light conversion element, an encapsulation layer disposed on the light emitting elements, an intermediate layer disposed between the light conversion element and one of the light emitting elements, and a protection layer disposed between the intermediate layer and the light emitting elements. The partition wall defines a plurality of cavities, and one of the cavities corresponds to one of the light emitting elements. The light conversion element is disposed in the one of the cavities.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 13 schematically illustrates a cross-sectional view of the light emitting device according to the eighth embodiment of the present disclosure.

FIG. 14 schematically illustrates the top views of the light emitting devices corresponding to a single opening according to different variant embodiments of the eighth embodiment of the present disclosure.

DETAILED DESCRIPTION

Figure 1:
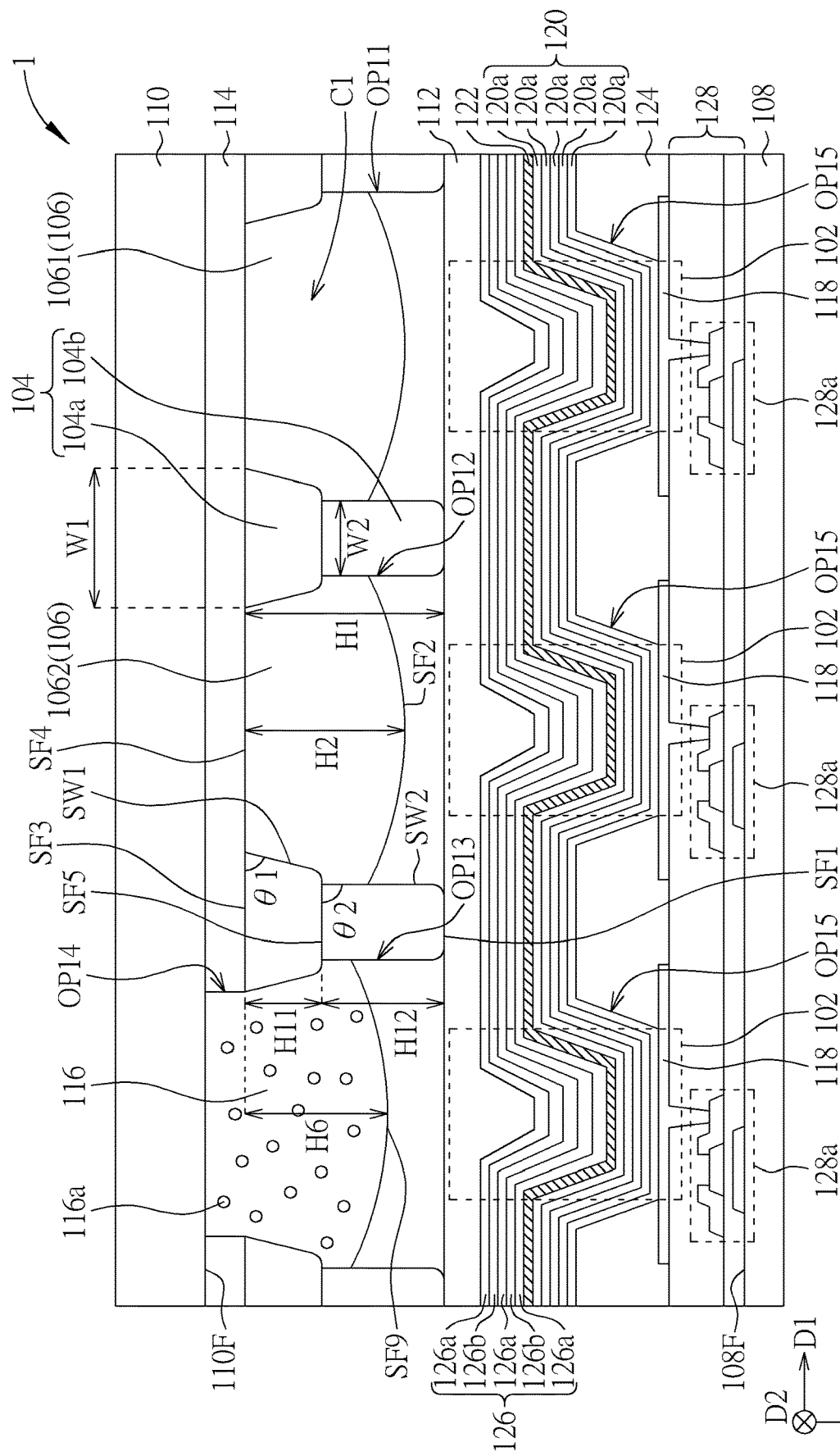
FIG. 1 schematically illustrates a cross-sectional view of the light emitting device according to the first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the light emitting device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function. In the following description and in the claims, the terms "comprise", "include" and "have" are used in an open-ended fashion, and thus should be interpreted to mean "include, but not limited to . . . ".

The direction terms used in the following embodiment such as up, down, left, right, in front of or behind are only the directions referring to the attached figures. Thus, the direction terms used in the present disclosure are for illustration, and are not intended to limit the scope of the present disclosure. It should be noted that the elements which are specifically described or labeled may exist in various forms for those skilled in the art. Besides, when a layer is referred to as being "on" another layer or substrate, it may be directly on the other layer or substrate, or may be on the other layer or substrate, or intervening layers may be included between other layers or substrates.

Besides, relative terms such as "lower" or "bottom", and "higher" or "top" may be used in embodiments to describe the relative relation of an element to another element labeled in figures. It should be understood that if the labeled device is flipped upside down, the element in the "lower" side may be the element in the "higher" side.

The ordinal numbers such as "first", "second", etc. are used in the specification and claims to modify the elements in the claims. It does not mean that the required element has any previous ordinal number, and it does not represent the order of a required element and another required element or the order in the manufacturing method. The ordinal number is only used to distinguish the required element with a certain name and another required element with the same certain name.

It should be noted that the technical features in different embodiments described in the following may be replaced, recombined, or mixed with one another to constitute another embodiment without departing from the spirit of the present disclosure.

In the present disclosure, the partition wall may block the light conversion ink filled in the cavity thereof from overflowing, thereby mitigating the problem of color mixing, in which the light conversion ink may for example include fluid-like liquid chemical mixing solution (color conversion ink, liquid color conversion, color conversion resist or color conversion resin) including such as quantum dots, phosphor, pigment, fluorescent material, or the like. In the present disclosure, the light emitting device with the partition wall may be any kind of device capable of converting the color of the light source light into another color. For example, the light emitting device may be a display device, an antenna device, a sensing device or a tiled device, but not limited thereto. The light emitting device may be a foldable light emitting device or a flexible light emitting device. The display device may for example include self-emissive display device such as organic light emitting diode (OLED) display device or inorganic light emitting diode display device, or includes non-self-emissive display equipment such as liquid crystal display device, but not limited thereto. The inorganic light emitting diode may for example include mini light emitting diode (mini LED), micro light emitting diode (micro LED) or quantum dot (QD) light emitting diode (such as QLED or QDLED). The antenna device may for example be a liquid crystal antenna, but not limited thereto. The tiled device may for example be a display tiled device or an antenna tiled device, but not limited thereto. It should be noted that the light emitting device may be combinations of the above-mentioned devices, but not limited thereto. As described therein, the display device is regarded as the light emitting device to detail the contents of the present disclosure, but the present disclosure is not limited thereto.

FIG. 1 schematically illustrates a cross-sectional view of the light emitting device according to the first embodiment of the present disclosure. As shown in FIG. 1, the organic light emitting diode display device is taken as an example of the light emitting device of the present embodiment, but not limited thereto. The light emitting device 1 may include a plurality of light emitting element 102, a partition wall 104 and a plurality of light conversion element 106. The partition wall 104 may include a plurality of openings respectively corresponding to the light emitting elements 102, and one of the light conversion elements 106 is disposed in one of the openings. When the light conversion element 106 is disposed in the opening, light source light generated by the light emitting element 102 may be absorbed by the light conversion element 106 and may be converted into a converted light with different color, in which the wavelength of the light source light generated by the light emitting element 102 is shorter than the wavelength of the converted light generated by the light conversion element 106. In the present embodiment, each of the openings may correspond to a light emitting element 102, and the openings may be divided into the opening OP11, the opening OP12 and the opening OP13, in which the light conversion elements 106 may not be disposed in the opening OP13, such that the light source light generated by the light emitting element 102 corresponding to the opening OP13 may directly pass through the opening OP13, and the light conversion elements 106 may be disposed in the opening OP11 and the opening OP12. Furthermore, the light conversion elements 106 may for example include a light conversion element 1061 and a light conversion element 1062 capable of generating converted light with different colors, and the light conversion element 1061 and the light conversion element 1062 may respectively be disposed in the opening OP11 and the opening OP12, such that the light conversion element 1061 and the light conversion element 1062 may respectively convert the light source light into the converted light with corresponding colors, and the output light with required colors may respectively be emitted from the opening OP11 and the opening OP12. Each of the light emitting elements 102 may correspond to a sub pixel, and the final output light emitted from the opening OP11, the opening OP12 and the opening OP13 along the direction opposite to the top view direction VD may respectively be the display light of the sub pixels with different colors. For example, the light emitting elements 102 may generate light source light with same color, such as blue light, and the light conversion element 1061 and the light conversion element 1062 located in the opening OP11 and the opening OP12 may for example generate the red converted light and the green converted light respectively. Therefore, the output light emitted from the opening OP11, the opening OP12 and the opening OP13 may respectively be the red light, the green light and the blue light, but the present disclosure is not limited thereto. In some embodiments, each of the opening OP11, the opening OP12 and the opening OP13 may have the light conversion element 106 disposed therein, and the light conversion elements 106 corresponding to the opening OP11, the opening OP12 and the opening OP13 may generate the converted lights with different colors. In such situation, the light conversion elements 106 may for example generate the red light, the green light and the blue light, and the light emitting elements 102 may for example generate the light source light with wavelength shorter than the wavelength of the red light, the wavelength of the green light and the wavelength of the blue light. For example, the light source light may be the blue light or the ultraviolet light, but not limited thereto.

In some embodiments, the light conversion element 106 may for example include phosphor material, fluorescent material, quantum dots particles or other light conversion materials capable of converting the color of the light, and the light conversion materials mentioned above may be arranged and combined arbitrarily, but not limited thereto.

The partition wall 104 may separate the converted light regions with different colors. For example, the partition wall 104 may include light blocking materials. The partition wall 104 may for example have an optical density higher than 3.0, but not limited thereto. Specifically, the light blocking material may for example include color paste, binder-polymer, monomer, photo-initiator, solvent, additives or combinations of at least two of the above-mentioned materials. The color paste may include carbon pigment, titanium pigment, white pigment, red pigment, green pigment, blue pigment or combinations of at least two of the above-mentioned materials. The binder-polymer may include acrylate copolymer. The monomer may for example include acrylate monomer. The photo-initiator may for example include main agent, auxiliary agent, induce agent, chain reaction agent or combinations of at least two of the above-mentioned materials. The solvent may for example include the materials capable of adjusting the boiling point. The additives may for example include materials having coatable or adhesive properties.

In some embodiments, the partition wall 104 may selectively include hydrophobic materials, such that the contact angle of the partition wall 104 and the light conversion ink injected or dropped into the opening OP11 and the opening OP12 of the partition wall 104 may be increased, thereby increasing the cohesion of the light conversion ink to reduce the possibility of overflowing of the light conversion ink. For example, the hydrophobic material may include fluoride, but not limited thereto. In some embodiments, the concentration of fluorine in the first sub-layer 104a may be different from the concentration of fluorine in the second sub-layer 104b. For example, the concentration of fluorine in the first sub-layer 104a may be less than the concentration of fluorine in the second sub-layer 104b, but not limited thereto. For example, the weight percentage concentration of fluorine in the first sub-layer 104a may range from 0 to 3, such that the light conversion ink has good leveling property, and the weight percentage concentration of fluorine in the second sub-layer 104b may range from 3 to 25, such that the light conversion ink may not be easily overflowed.

In the present embodiment, the light conversion element 106 is formed by injecting or dropping the light conversion ink in the corresponding opening and then baking the light conversion ink through a baking process. Because the light conversion ink is a liquid fluid before it is solidified, the viscosity of the light conversion ink may be adjusted, and the light conversion ink may have high fluidity. Therefore, in order to reduce the possibility of overflowing of the light conversion ink from the corresponding opening due to its high fluidity, the thickness H1 of the surface SF1 of the partition wall 104 may be higher than the thickness H2 of the surface SF2 of one of the light conversion elements 106. In the present embodiment, the thickness H1 of the surface SF1 of the partition wall 104 and the thickness H2 of the surface SF2 of the light conversion elements 106 may be calculated from a level (such as light blocking layer 114) on which the partition wall 104 and the light conversion element 106 are disposed, but not limited thereto. When the surface SF2 of the light conversion element 106 is an arc shape, the thickness H2 is the maximum thickness from the level on which the partition wall 104 is disposed to the top point of the surface SF2, or, when the surface SF2 is nearly a plane, any position on the surface SF2 may be used to calculate the thickness H2. For example, the thickness H1 of the partition wall 104 formed by baking may be higher than the thickness H2 of the light conversion element 106 formed by baking, for example, the thickness H1 of the partition wall 104 may range from 4 micrometers (μm) to 30 micrometers, but not limited thereto. Furthermore, because the thickness H1 of the single layer partition wall formed by coating once is less than 5 micrometers, in order to make the partition wall 104 have enough thickness to block the light conversion element 106 from overflowing, the partition wall 104 may include multi-layer structure. For example, the multi-layer structure may include a first sub-layer 104a and a second sub-layer 104b, in which the first sub-layer 104a is disposed on the substrate of the light emitting device 1, the second sub-layer 104b is disposed on the first sub-layer 104a, and the first sub-layer 104a and the second sub-layer 104b may be formed in different steps. Under such condition, the thickness of the partition wall 104 may be defined as the thickness of the entire stack of the first sub-layer 104a and the second sub-layer 104b.

In the present embodiment, the light emitting device 1 may include a first substrate 108 and a second substrate 110, the light emitting element 102 is disposed on the first substrate 108, and the partition wall 104 and the light conversion element 106 are disposed on the second substrate 110. Thus, according to the embodiment shown in FIG. 1, the surface SF1 of the partition wall 104 may be the surface of the partition wall 104 away from the second substrate 110 (or close to the surface 108F of the first substrate 108), the surface SF2 of the light conversion element 106 is the surface of the light conversion element 106 away from the second substrate 110 (or close to the surface 108F of the first substrate 108), and the surface SF3 of the partition wall 104 and the surface SF4 of the light conversion element 106 are respectively the surface of the partition wall 104 and the surface of the light conversion element 106 close to the surface 110F of the second substrate 110. Besides, the first substrate 108 and the second substrate 110 may be assembled through the intermediate layer 112. The intermediate layer 112 may for example be an adhesive layer or a sealant layer which are sticky, but not limited thereto. In some embodiments, the multi-layer structure may also include three or more sub-layers stacked in sequence. In some embodiments, the first substrate 108 and the second substrate 110 may respectively be a rigid substrate (such as glass substrate, plastic substrate, quartz substrate or sapphire substrate) or a flexible substrate (such as polyimide (PI) or polyethylene terephthalate (PET)), but not limited thereto.

In some embodiments, in order to reduce the possibility of breakage or cracking of the layer for coating during the coating of the second sub-layer 104b, the thickness H11 of the first sub-layer 104a may for example be less than the thickness H12 of the second sub-layer 104b, but not limited thereto. When the second sub-layer 104b is disposed on the first sub-layer 104a, the thickness H11 of the first sub-layer 104a may be the distance between a surface (such as the surface SF3 of the partition wall) and another surface SF5 of the first sub-layer 104a, and the thickness H12 of the second sub-layer 104b may be the distance between a surface (such as the surface SF5 of the first sub-layer 104a) and another surface (such as the surface SF1 of the partition wall) of the second sub-layer 104b. For example, the thickness of the formed first sub-layer 104a may range from 0.9 micrometers to 2.0 micrometers, and the thickness of the second sub-layer 104b may range from 2.0 micrometers to 4.0 micrometers. In some embodiments, the taper angles of the sub-layers may be increased in sequence according to the stacking order, such that the sidewall of the sub-layer closer to the substrate on which the sub-layer is disposed (such as the second substrate 110) may be gentler, which indicates that the taper angle of the sub-layer away from the substrate on which the sub-layer is disposed may be higher than the taper angle of the sub-layer closer to the substrate on which the sub-layer is disposed. Through this design, the possibility of breakage or cracking of layer for coating during the coating of another sub-layer on the sub-layer may be mitigated. For example, the first sub-layer 104a includes a first sidewall SW1, the second sub-layer 104b includes a second sidewall SW2, and the taper angle θ1 of the first sidewall SW1 relative to the second substrate 110 is less than the taper angle θ2 of the second sidewall SW2 relative to the second substrate 110, wherein the taper angle θ1 of the first sub-layer 104a may be the included angle of the first sidewall SW1 and a surface of the first sub-layer 104a close to the second substrate 110 (such as the surface SF3 of the partition wall), and the taper angle θ2 of the second sub-layer 104b may be the included angle of the second sidewall SW2 and the second sub-layer 104b close to the second substrate 110 (that is, the surface SF5 of the first sub-layer 104a). Through this design, the possibility of breakage or cracking of layer for coating during the coating of another sub-layer on the sub-layer may be reduced. The detailed description will be further described in the method of manufacturing the light emitting device 1 below. For example, the taper angle θ1 of the first sub-layer 104a may range from 35 degrees to 85 degrees, and the taper angle θ2 of the second sub-layer 104b may range from 75 degrees to 90 degrees, but not limited thereto. Mainly, the sidewall of the sub-layer close to the substrate on which the sub-layer is disposed needs to have a gentle slope to reduce the possibility of the problems during the manufacturing process.

In some embodiments, the bottom widths of the sub-layers may be reduced in sequence according to the stacking order, in which the bottom width of the sub-layer may be the width of the surface of the sub-layer close to the substrate on which the sub-layer is disposed in a horizontal direction. For example, the bottom width W1 of the first sub-layer 104a (the width of the first sub-layer 104a close to the second substrate 110 in the horizontal direction) may be higher than the bottom width W2 of the second sub-layer 104b (the width of the second sub-layer 104b close to the second substrate 110 in the horizontal direction), such that the first sub-layer 104a has enough area for disposing the second sub-layer 104b. The horizontal direction may for example be the first direction D1 or the second direction D2.

In some embodiments, the light emitting device 1 may selectively include a light blocking layer 114 having a function of selecting the light with specific wavelength and being disposed between the light conversion element 106 and the second substrate 110, such that the light blocking layer 114 may block, suppress, reflect, and recycle the light source light with a specific wavelength generated by the light emitting elements 102 from being emitted from the regions of the second substrate 110 corresponding to the light conversion elements 106, thereby improving the purity of the output light emitted from the regions corresponding to the light conversion elements 106 (that is, the color of the output light may be close to the color of the converted light generated by the corresponding light conversion element 106). The structure of the light blocking layer 114 may be multi-layers formed of alternately stacked distributed Bragg reflectors with different refractive index or a color filter (such as red photoresist, yellow photoresist, green photoresist or the like), but not limited thereto. In some embodiments, the light blocking layer 114 may partially or completely extend to be located between the partition wall 104 and the second substrate 110. In some embodiments, when the color of the light generated by the light emitting element 102 may not be converted by the light conversion element 106, the light blocking layer 114 may include an opening OP14, corresponding to the opening OP13 of the partition wall 104, but not limited thereto.

In some embodiments, the light emitting device 1 may selectively include a light scattering layer 116 disposed in the opening OP13 and the opening OP14. The thickness H6 of the light scattering layer 116 may be less than the thickness H1 of the partition wall 104, so as to reduce the possibility of overflowing of the light scattering solution from the corresponding opening OP13 due to its high fluidity during the manufacturing process. In the present embodiment, the thickness H6 of the surface SF9 of the light scattering layer 116 may be calculated from the level which is the same as the level of the surface SF3 of the partition wall 104 (such as the dotted line extended from the surface SF3 of the partition wall 104 shown in FIG. 1), but not limited thereto. When the surface SF9 of the light scattering layer 116 is an arc shape, the thickness H6 may be the maximum thickness from the level which is the same as the surface SF3 of the partition wall 104 to the top point of the surface SF9, or, when the surface SF9 is nearly a plane, any position on the surface SF9 may be used to calculate the thickness H6. In the present embodiment, the surface SF9 of the light scattering layer 116 is the surface of the light scattering layer 116 away from the second substrate 110 on which the light scattering layer 116 is disposed and close to the first substrate 108. The light scattering layer 116 may for example includes a plurality of scattering particles 116a, but not limited thereto. The material of the scattering particles 116a may for example include titanium oxide ($TiO_2$) or structured particles having scattering property, but not limited thereto. In some embodiments, the light blocking layer 114 may be formed between the formation of the partition wall 104 and the formation of the light conversion element 106, thus, the light blocking layer 114 may be located in the opening OP11 and the opening OP12 of the partition wall 104.

In some embodiments, because the opening OP11 and the opening OP12 of the partition wall 104 are not completely filled with the light conversion element 106, a functional layer may be optionally filled in the space of the opening OP11 and the opening OP12 which are not filled with the light conversion element 106. In other embodiments, when the opening OP11 and the opening OP12 of the partition wall 104 are completely filled with the light conversion element 106, the functional layer may also be disposed on the light conversion element 106, the present disclosure is not limited thereto. For example, another light scattering layer, a reflective layer, a planarization layer, a protection layer or an encapsulation layer may be disposed in the opening OP11 and the opening OP12 in which the light conversion element 106 is disposed, and the planarization layer or the encapsulation layer may be disposed in the opening OP13 in which the light conversion element 106 is not disposed. In the present embodiment, the optical transmissive layer (such as blue light transmissive layer) allowing the blue light that is not completely converted to penetrate through or the light reflective layer (such as non-blue light reflective layer) reflecting the completely converted light may be further disposed. The light scattering layer may be used to uniformly diffuse the converted light generated by the light conversion element 106, and the light conversion element 106 may for example include scattering particles. The reflective layer may be used to reflect the converted light generated by the light conversion element 106 and make the converted light generated by the light conversion element 106 be emitted toward the second substrate 110 from the opening OP11 and the opening OP12, thereby increasing the pure converted light emitted from the light conversion element 106 to the outside of the second substrate 110. When the light emitting device 1 is the device with a single substrate, the optical reflective layer (such as the blue light reflective layer) reflecting the blue light that is not completely converted or the light transmissive layer (such as the non-blue light transmissive layer) allowing the completely converted light to penetrate through may be disposed. For example, the reflective layer may include distributed Bragg reflectors, but not limited thereto. The planarization layer and the encapsulation layer may be used to protect the light conversion element 106. The planarization layer may for example be a protection layer to protect the light conversion layer 106, in which the planarization layer may for example include an alternately stacked structure of organic material layers and inorganic material layers to prevent moisture and oxygen from entering. The encapsulation layer may for example include organic packaging materials or inorganic packaging materials.

The light emitting element 102 of the present embodiment may for example be an organic light emitting diode or an inorganic light emitting diode, but not limited thereto. In some embodiments, the light emitting element 102 may for example be a mini light emitting diode, a micro light emitting diode or a quantum dot light emitting diode, but not limited thereto. In the present embodiment, the organic light emitting diode is taken as an example of the light emitting device. The light emitting device 1 may include a plurality of pixel electrodes 118, an organic layer 120 and a common electrode 122 disposed on the first substrate 108 in sequence, and each of the pixel electrodes 118, a portion of the organic layer 120 and a portion of the common electrode 122 may form a light emitting element 102, but not limited thereto. In some embodiments, the organic layer 120 may include a plurality of layers 120a, in which the layer 120a may for example include organic light emitting layer, hole transport layer, hole injection layer, electron transport layer, electron injection layer and electric charge generation layer, but not limited thereto. In some embodiments, the layer 120a may also include a plurality of organic light emitting layers. In some embodiments, the organic layer 120 may be a single organic light emitting layer, but not limited thereto.

In the present embodiment, the light emitting device 1 may further include a pixel defining layer 124 including a plurality of openings OP15, and each of the light emitting element 102 is respectively disposed in the corresponding one of the opening OP15. Therefore, each of the openings OP15 may respectively correspond to one of the opening OP11, the opening OP12 and the opening OP13. Specifically, the pixel defining layer 124 may be disposed on the pixel electrodes 118, each of the openings OP15 may expose a portion of the corresponding one of the pixel electrodes 118 during the manufacturing process, and the organic layer 120 and the common electrode 122 may be sequentially stacked on the pixel defining layer 124 and extend to each of the opening OP15. The organic layer 120 of the present embodiment is formed on the entire surface of the pixel defining layer 124, but not limited thereto. In some embodiments, the organic layer 120 may also be formed into multiple blocks which are respectively located in the corresponding openings OP15. In some embodiments, the pixel defining layer 124 and the partition wall 104 may include the same light shielding material. Therefore, the pixel defining layer 124 may also be used to separate the lights with different colors.

The light emitting device 1 may further include a protection layer 126 at least partially covering the light emitting element 102 to protect the light emitting element 102 from oxidation by moisture or oxygen. In some embodiments, the protection layer 126 may include multi-layer structure. For example, the multi-layer structure may include a plurality of inorganic material layers 126a and a plurality of organic material layers 126b which are alternately stacked, such as the stack of the inorganic material layer 126a, the organic material layer 126b, the inorganic material layer 126a, the organic material layer 126b and the inorganic material layer 126a or the stack of the organic material layer 126b, the inorganic material layer 126a, the organic material layer 126b and the inorganic material layer 126a, but not limited thereto. In some embodiments, the multi-layer structure may include the stack of the plurality of inorganic material layers 126a, but not limited thereto.

The light emitting device 1 may further include a thin film transistor layer 128 to control the turn on/turn off state of the light emitting element 102 and the brightness of the light generated by the light emitting element 102. Taking the organic light emitting diode display device as an example, the thin film transistor layer 128 may include a plurality of driving elements 128a and a plurality of switch elements (not shown), and each of the light emitting elements 102 may be controlled by at least one driving element 128a and at least one switch element. That is, the pixel electrode 118 of each of the light emitting elements 102 may be electrically connected to the corresponding driving element 128a, but not limited thereto. In some embodiments, the thin film transistor layer 128 may further include circuits to control the display of the light emitting device 1, such as scan lines, data lines or other driving circuits, but not limited thereto. The structure of the thin film transistor of the thin film transistor layer 128 is not limited to the bottom-gate type transistor shown in FIG. 1, and may for example be the top-gate type transistor or the low-temperature polysilicon transistor, but not limited thereto.

Figure 2:
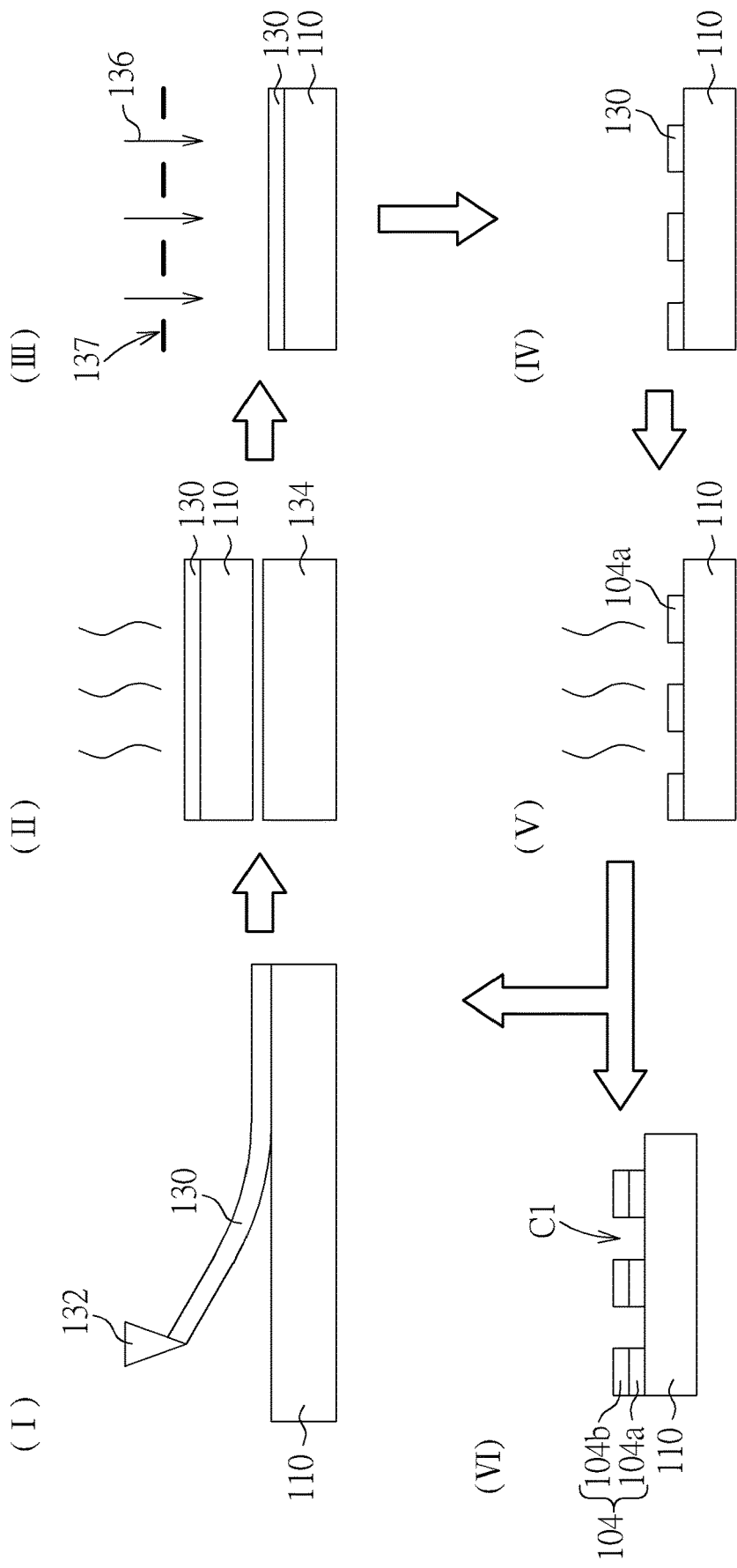
FIG. 2 schematically illustrates each step of manufacturing the partition wall according to an embodiment of the present disclosure.
Figure 3:
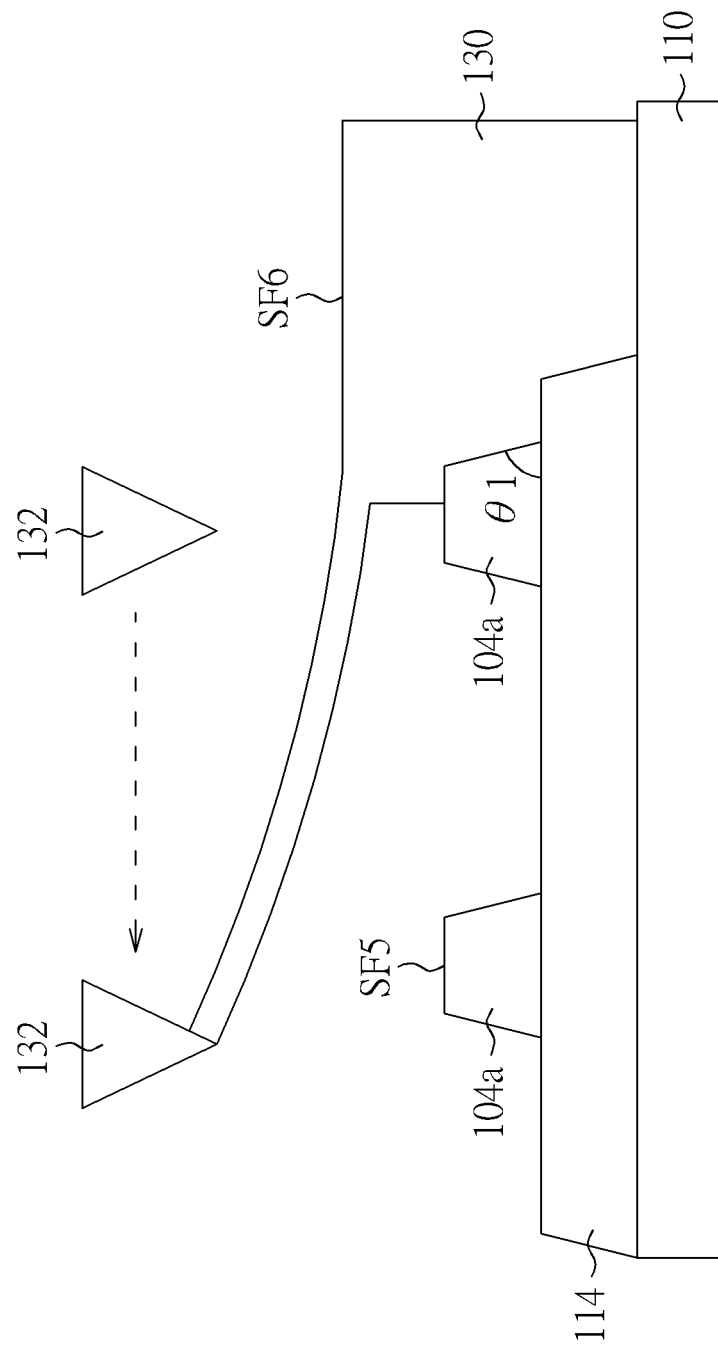
FIG. 3 schematically illustrates the step of coating the second sub-layer.

The method of manufacturing the light emitting device 1 of the present embodiment will be described in detail in the following contents. FIG. 2 schematically illustrates each step of manufacturing the partition wall according to an embodiment of the present disclosure, and FIG. 3 schematically illustrates the step of coating the second sub-layer. For easier explanation, the light blocking layer 114 is omitted in FIG. 2, but not limited thereto. The method of manufacturing the light emitting device of the present embodiment will be described in detail below with reference to FIG. 1 to FIG. 3. As shown in FIG. 1, the first substrate 108 is provided at first, and then, the thin film transistor layer 128 is formed on the first substrate 108. After that, the light emitting elements 102 are disposed on the thin film transistor layer 128. The process of disposing the light emitting elements 102 may include forming the pixel electrode 118 which is electrically connected to the thin film transistor layer 128, forming the pixel defining layer 124, forming the organic layer 120 and forming the common electrode 122. After that, the protection layer 126 may be formed on the light emitting elements 102.

In addition, as shown in FIG. 1 and FIG. 2, the second substrate 110 is provided, and the light blocking layer 114 may be optionally formed on the second substrate 110. After that, the partition wall 104 may be formed on the light blocking layer 114. The formation method of the partition wall 104 will be described in detail below. First, the step I may be performed to dispose the insulating layer 130 on the second substrate 130. The disposition of the insulating layer 130 may be performed by coating process, that is, the light shielding material is coated on the second substrate 110 by a nozzle 132 to form the insulating layer 130. After that, the step II may be performed to dispose the second substrate 110 on which the insulating layer 130 is formed on a heated board 134 to bake the insulating layer 130, thereby removing the solvent in the insulating layer 130. Subsequently, the insulating layer 130 may be patterned through the photomask 137, which is performing the exposure process of the step III. The photomask 137 may define the position of the partition wall 104, and the developing process of the step IV may be performed to remove the portion of the insulating layer 130 which is not the partition wall 104 through the developer, thereby defining the partition wall 104 and the openings. For example, the insulating layer 130 may include photoresist material, and a portion of the insulating layer 130 may be irradiated with the light 136, such as ultraviolet light, in the exposure process. Therefore, after the exposure process, the solubility of different portions of the photoresist material to the developer may be different. In some embodiments, the insulating layer 130 may optionally include hydrophobic material to improve the cohesion of the light conversion ink and reduce the possibility of overflowing of the light conversion ink. For example, the hydrophobic material may include fluoride, but not limited thereto. According to the type of the photoresist material, the developer may remove the exposed portion or the non-exposed portion of the photoresist material. After that, the baking process of the step V may be performed to remove the developer and bake the remaining insulating layer 130, such that a single sub-layer (such as the first sub-layer 104a) of the partition wall 104 may be formed. After that, the step I to the Step V may be performed again. After the step I to step V are repeatedly performed at least two times, at least another sub-layer (such as the second sub-layer 104b) may be formed on the sub-layer. The number of repetition may be adjusted according to the required number of the sub-layer, which is not limited to the present embodiment, and the number of repetition may at least be one. It is worthy noted that the partition wall 104 of the present embodiment is formed by performing the step I to step V repeatedly, therefore, the partition wall 104 with enough thickness and uniform thickness may be formed.

As shown in FIG. 3, after the first sub-layer 104a is formed and the step I is repeated, the surface SF6 of the insulating layer 130 on which the second sub-layer 104b is coated may be higher than the surface SF5 of the first sub-layer 104a, so as to reduce the possibility of breakage or cracking of the layer for coating the insulating layer 130 due to the shear stress of the first sub-layer 104a, thereby reducing the problems of uneven thickness of the layer or incomplete coating of the insulating layer 130 due to breakage or cracking of coating. Furthermore, because the equipment used in coating of the insulating layer 130 includes a sensor used to detect the distance between the nozzle 132 and the coating surface, when the surface SF5 of the first sub-layer 104a is higher than the surface SF6 of the insulating layer 130 of the second sub-layer 104b, the sensor may easily shutdown due to the detection of approaching of the nozzle to the surface SF5 of the first sub-layer 104a, and the parameters of the equipment needs to be further adjusted, resulting in prolonged production time and higher production costs. Besides, when the surface SF5 of the first sub-layer 104a is higher than the surface SF6 of the insulating layer 130 of the second sub-layer 104b, the ups and downs of the insulating layer 130 during coating may likely to be too large, resulting in uneven film thickness. Accordingly, in the method of the present embodiment, the surface SF6 of the insulating layer 130 may be higher than the surface SF5 of the first sub-layer 104a through coating of the second sub-layer 104b, and the problems in the process of forming a plurality of sub-layers may be improved. Moreover, by reducing the taper angle θ1 of the first sub-layer 104a, for example, the taper angle θ1 may range from 35 degrees to 85 degrees, the shear stress of the first sub-layer 104a may be reduced when coating the insulating layer 130 of the second sub-layer 104b, thereby reducing the problems of breakage or cracking. It should be noted that the surface SF6 of the insulating layer 130 is not baked, and the surface SF1 of the partition wall 104 is baked in the present embodiment, therefore, the surface SF6 may be different from the surface SF1, but not limited thereto. The surface SF6 and the surface SF1 may also be the same.

The formed partition wall 104 and the disposed layers (such as the second substrate 110 or the light blocking layer 114) may define a plurality of cavities C1 respectively corresponding to the opening OP11, the opening OP12 and the opening OP13 shown in FIG. 1. In the present embodiment, the opening OP11, the opening OP12 and the opening OP13 of the partition wall 104 may form the cavity C1 with the second substrate 110 or the layers thereon. After the partition wall 104 is formed, the light conversion ink may be injected or dropped into at least the part of the cavity C1. The light conversion ink may for example include light conversion material and solvent. For example, the light conversion ink may include quantum dot, fluorescent powder, phosphor powder, but not limited thereto. Accordingly, the light conversion ink may be injected or dropped into the opening OP11 and the opening OP12 through inkjet printing process, but not limited thereto. Because the partition wall 104 of the present embodiment has enough thickness, such that the surface of the partition wall 104 may be higher than the surface of the light conversion ink in the step of filling the light conversion ink, the partition wall 104 can block the light conversion ink from overflowing, thereby reducing the problem of mixing color. After that, the light conversion ink is baked such that the light conversion ink is contracted toward the second substrate 110 to form the light conversion element 106. In some embodiments, after the light conversion element 106 is formed, the above-mentioned functional layers such as light scattering layer, reflective layer, planarization layer, protection layer or encapsulation layer may further be formed on the light conversion element 106, but not limited thereto. After that, the protection layer 126 and the partition wall 104 are assembled through the intermediate layer 112 to form the light emitting device 1 of the present embodiment.

In some embodiments, because the formation of the partition wall 104, the light conversion element 106 and other layers on the second substrate 110 would not affect the steps performed on the first substrate 108, the steps of forming the partition wall 104, the light conversion element 106 and other layers on the second substrate 110 may be performed before, after or simultaneously with the steps performed on the first substrate 108. In some embodiments, the partition wall 104 may also be disposed on the first substrate 108 on which the thin film transistor layer 128 is disposed through the above-mentioned methods.

The light emitting device and the manufacturing method thereof of the present disclosure are not limited to the above-mentioned embodiments, and may include different embodiments or variant embodiments. In order to simplify the description, the elements of different embodiments and variant embodiments and the same element of the first embodiment will use the same label. In order to compare the difference between the first embodiment and different embodiments and variant embodiments, the following contents would focus on the difference between different embodiments or variant embodiments, and the repeated portion will not be redundantly described.

Figure 4:
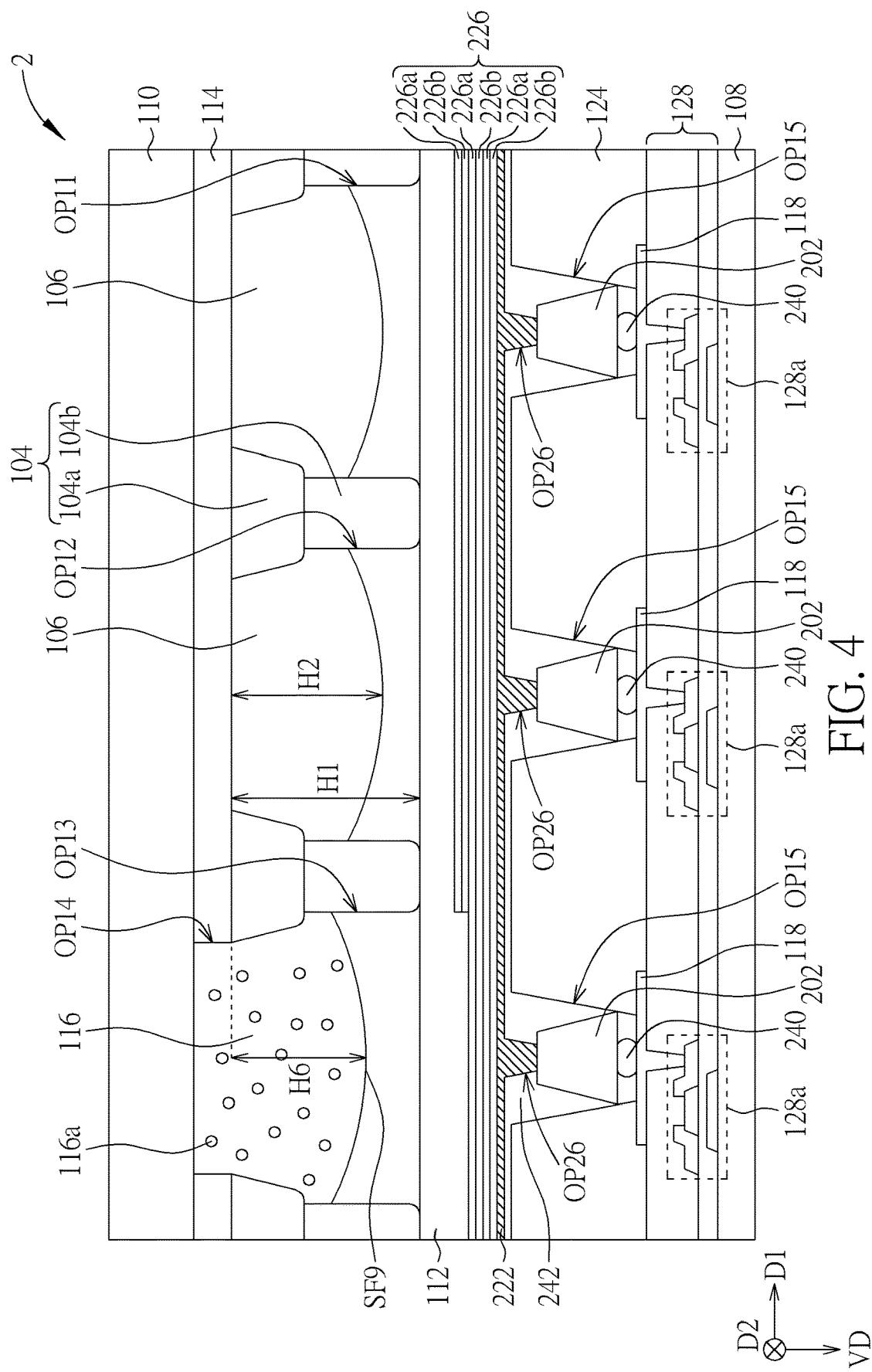
FIG. 4 schematically illustrates a cross-sectional view of the light emitting device according to a variant embodiment of the first embodiment of the present disclosure.

FIG. 4 schematically illustrates a cross-sectional view of a light emitting device according to a variant embodiment of the first embodiment of the present disclosure. As shown in FIG. 4, the difference between the light emitting device 2 of the present variant embodiment and the light emitting device of the first embodiment shown in FIG. 1 is that the light emitting element 202 may be inorganic light emitting diode, such as mini light emitting diode, micro light emitting diode or quantum dot light emitting diode, but not limited thereto. In the present embodiment, the light emitting element 202 may be disposed in the corresponding opening OP15 of the pixel defining layer 124, and the light emitting element 202 may be electrically connected to the corresponding pixel electrode 118 through a conductive element 240. The conductive element 240 may for example include solder ball, conductive glue or other suitable conductive materials. The light emitting device 2 may further include a filling layer 242 surrounding the light emitting elements 202, and the filling layer 242 may include a plurality of openings OP26 respectively expose the corresponding light emitting elements 202, such that the common electrode 222 may be electrically connected to the light emitting elements 202 through the openings OP26. In the present embodiment, the protection layer 226 may for example include the stack of a plurality of organic material layers and a plurality of inorganic material layers or the stack of a plurality of inorganic material layers. In some embodiments, the stack of the plurality of inorganic material layers or the stack of the plurality of organic material layers and the plurality of inorganic material layers may further include a plurality of first refractive index layers 226a and a plurality of second refractive index layers 226b, and the first refractive index layers 226a and the second refractive index layers 226b may be alternately stacked on the common electrode 222, in which the refractive index of the first refractive index layer 226a is different from the refractive index of the second refractive index layer 226b, such that the protection layer 226 may allow the light with specific wavelength to penetrate and reflect the light with another specific wavelength. For example, the light source light emitted from the light emitting element 202 with light source wavelength may penetrate through the protection layer 226, and the converted light converted by the light conversion element 106 with the converted wavelength would be reflected back to the light conversion element 106 when the converted light encounters the protection layer 226. For example, the first refractive index layer 226a may include silicon oxide, and the second refractive index layer 226b may include silicon nitride, but not limited thereto, and vice versa. When the protection layer 226 includes the stack of the plurality of organic material layers and the plurality of inorganic material layers, the structure of the protection layer 226 may be similar to the protection layer 126 of the first embodiment shown in FIG. 1, but not limited thereto. In some embodiments, the number of layers of the protection layer 226 corresponding to the opening OP11 and the opening OP12 which are filled with the light conversion element 106 may be higher than the number of layers of the protection layer 226 corresponding to the opening OP13 which is filled with the light scattering layer 116, but not limited thereto. In some embodiments, the inorganic light emitting diode may for example be the face up type light emitting diode chip, the vertical structure type light emitting diode chip or the flip chip type light emitting diode chip.

Figure 5:
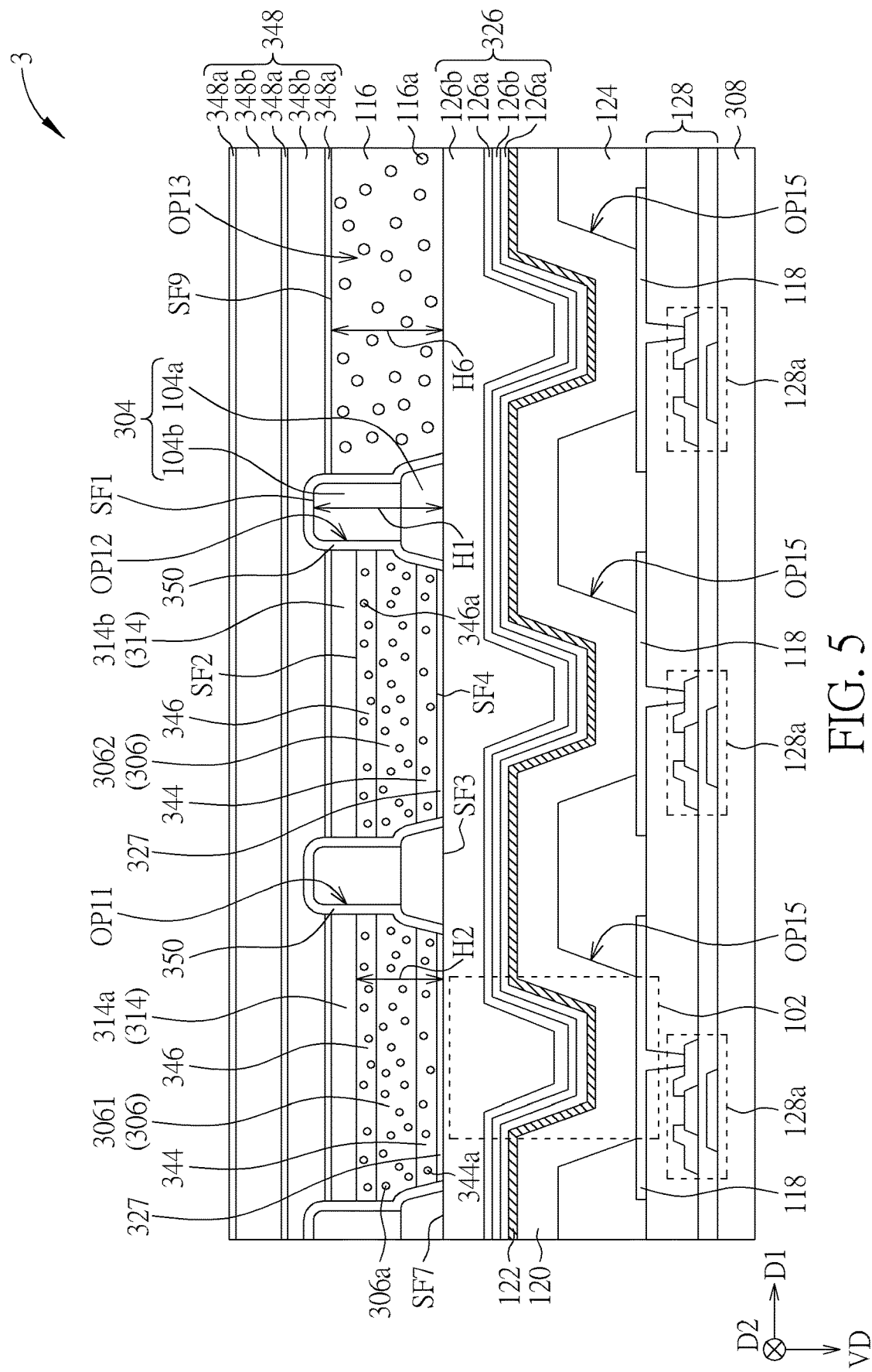
FIG. 5 schematically illustrates a cross-sectional view of the light emitting device according to the second embodiment of the present disclosure.

FIG. 5 schematically illustrates a cross-sectional view of a light emitting device according to a second embodiment of the present disclosure. As shown in FIG. 5, the difference between the light emitting device 3 of the present embodiment and the light emitting device of the first embodiment shown in FIG. 1 is that the light emitting device 3 includes a single substrate 308. The substrate 308 of the present embodiment may for example be the first substrate of the first embodiment, but the partition wall 304 and the light conversion element 306 are disposed on the substrate 308. Therefore, the thin film transistor layer 128, the pixel defining layer 124, the light emitting elements 102 and the protection layer 326 are formed on the substrate 308. Besides, the partition wall 304 is disposed on the protection layer 326, the light conversion elements 306 are disposed on the protection layer 326, and the light scattering layer 116 is disposed on the protection layer 326. Accordingly, in the embodiment shown in FIG. 5, the surface SF1 of the partition wall 304 is the surface of the partition wall 304 away from the substrate 308, the surface SF2 of the light conversion element 306 is the surface of the light conversion element 306 away from the substrate 308, and the surface SF3 of the partition wall 304 and the surface SF4 of the light conversion element 306 are respectively the surface of the partition wall 304 close to the substrate 308 and the surface of the light conversion element 306 close to the substrate 308. In the present embodiment, the protection layer 326 may include a surface SF7, and the first sub-layer 104a and the second sub-layer 104b of the partition wall 304 are formed on the surface SF7 of the protection layer 326 in sequence. The light emitting device 3 of the present embodiment may optionally include a light scattering layer 344 and a light scattering layer 346, the light scattering layer 344 is disposed between the light conversion element 306 and the protection layer 326, and the light scattering layer 346 is disposed between the light conversion element 306 and the light blocking layer 314. In some embodiments, the light emitting device 3 may include one of the light scattering layer 344 and the light scattering layer 346. In some embodiments, the light scattering layer 344 and the light scattering layer 346 may include scattering particles 344a and 346a. The material of the scattering particles 344a and 346a may for example include titanium oxide or the structured particles having scattering function, but not limited thereto. In some embodiments, the light conversion element 306 may include light conversion particles 306a. The material of the light conversion particle 306a may for example include quantum dot material, fluorescent material or phosphor material, but not limited thereto. In some embodiments, the light conversion layer 306, the light scattering layer 344 and the light scattering layer 346 may be integrated into a single layer, that is, the scattering particles 344a, the scattering particles 346a and the light conversion particles 306a may be disposed in the light conversion element 306, in which the material of the light conversion particles 306a may for example include quantum dot material, fluorescent material or phosphor material, but not limited thereto.

In some embodiments, the light emitting device 3 may optionally include another protection layer 348 to protect the light conversion element 306. The protection layer 348 may at least cover the partition wall 304, the light blocking layer 314 and the light scattering layer 116. For example, the protection layer 348 may include multi-layer structure, such as the alternately stacked inorganic material layer 348a, the organic material layer 348b, the inorganic material layer 348a and the organic material layer 348b, but not limited thereto. In some embodiments, the multi-layer structure of the protection layer 348 may also include the stack of the plurality of inorganic material layers 348a. In some embodiments, when there is still space in the opening OP11, the opening OP12 and the opening OP13 of the partition wall 304, at least the part of the protection layer 348 may be disposed in the opening OP11, the opening OP12 and the opening OP13.

In some embodiments, the light emitting device 3 may optionally include a light blocking layer 314. The light blocking layer 314 may include a first light blocking layer 314a and a second light blocking layer 314b respectively located in the opening OP11 and the opening OP12. The first light blocking layer 314a and the second light blocking layer 314b may respectively include color filters with different colors. For example, the first light blocking layer 314a may include the color filter allowing the light generated from the light conversion element 3061 to penetrate through, such as red color filter, and the second light blocking layer 314b may include the color filter allowing the converted light generated from the light conversion element 3062 to penetrate through, such as green color filter. In some embodiments, the first light blocking layer 314a and the second light blocking layer 314b may be the color filters with the same color, such as yellow color filter, which may block or absorb the light having a specific wavelength that is not required to be emitted from the protection layer 348, and allow the converted light generated from the light conversion element 3061 or the light conversion element 3062 having a converted light wavelength to be emitted from the protection layer 348, but not limited thereto.

In the present embodiment, the light emitting device 3 may optionally include a hydrophobic layer 350 at least partially covering the surface of the partition wall 304. When the light conversion ink is injected into the opening OP11 and the opening OP12 of the partition wall 304, the contact angle between the light conversion ink and the hydrophobic layer 350 may be increased due to the hydrophobic property of the hydrophobic layer 350, such that the cohesion of the light conversion ink is increased, thereby reducing the overflow of the light conversion ink.

The manufacturing method of the light emitting device 3 of the present embodiment will be further described below. Referring to FIG. 5, in the manufacturing method of the light emitting device 3 of the present embodiment, the steps before the formation of the protection layer 326 may be the same as the steps of forming the thin film transistor layer 128, the light emitting elements 102 and the pixel defining layer 124 on the first substrate 108 in the first embodiment, and will not be redundantly described here. After the light emitting elements 102 are formed, the protection layer 326 may be formed on the light emitting elements 102, for example, the inorganic material layer 126a, the organic material layer 126b, the inorganic material layer 126a and the organic material layer 126b may be formed on the light emitting elements 102 in sequence. After that, the partition wall 304 is formed on the protection layer 326. In the present embodiment, the first sub-layer 104a and the second sub-layer 104b are formed on the protection layer 326 in sequence, and the thickness of the first sub-layer 104a is less than the thickness of the second sub-layer 104b. The method of forming the partition wall in the present embodiment may be the same as the method in the first embodiment, and will not be redundantly described here.

After the partition wall 304 is formed, a hydrophobic surface treatment may be performed on the partition wall 304 to form a hydrophobic layer 350 on the exposed surface of the partition wall 304. The hydrophobic layer 350 may include hydrophobic material such as fluoride or other hydrophobic material, but not limited thereto. After that, a plurality of inorganic material layers 327 may optionally be formed on the protection layer 326 that is in the opening OP11 and the opening OP12 of the partition wall 304. The material of the inorganic material layers 327 may include silicon nitride or silicon oxide, in which the refractive indexes of the stacked inorganic material layers 327 may be different from each other, such that a specific wavelength of the light which can penetrate through the inorganic material layers 327 and another specific wavelength of another light which can be reflected by the inorganic material layers 327 may be chosen. For example, the light source light emitted from the light emitting element 102 with the light source wavelength may penetrate through the plurality of inorganic material layers 327, and the converted light converted by the light conversion element 306 with the converted light wavelength may be reflected back to the light conversion element 306 when it encounters the plurality of inorganic material layers 327, or the plurality of inorganic material layer 327 may be located in the protection layer 326, but not limited thereto. That is, the combination or separation of the inorganic material layer 327 and the protection layer 326 may be decided according to different optical demands, structures, or thicknesses of the protection layer. Then, the light scattering layer 344, the light conversion element 306 and the light scattering layer 346 may be formed in the opening OP11 and the opening OP12 of the partition wall 304. The method of forming the light scattering layer 344, the light conversion element 306 and the light scattering layer 346 may for example include forming the light scattering layer 344, the light conversion element 306 and the light scattering layer 346 in the opening OP11 and the opening OP12 in sequence, but not limited thereto. After that, the light scattering layer 116 may be formed in the opening OP13 of the partition wall 304. In some embodiments, the step of forming the light scattering layer 116 may be performed before the steps of forming the light scattering layer 344, the light conversion element 306 and the light scattering layer 346. Then, the protection layer 348 may be formed on the partition wall 304, the light blocking layer 314 and the light scattering layer 116 to form the light emitting device 3 of the present embodiment. In the present embodiment, because the inorganic material layers 327 are manufactured in the opening OP11 and the opening OP12, the thickness H2 of the light conversion element 306 may for example be the distance from the surface SF7 of the protection layer 326 to the surface of the light conversion element 306. Similarly, the thickness H6 of the light scattering layer 116 may be defined as the distance from the surface SF7 of the protection layer 326 to the surface of the light scattering layer 116.

Figure 6:
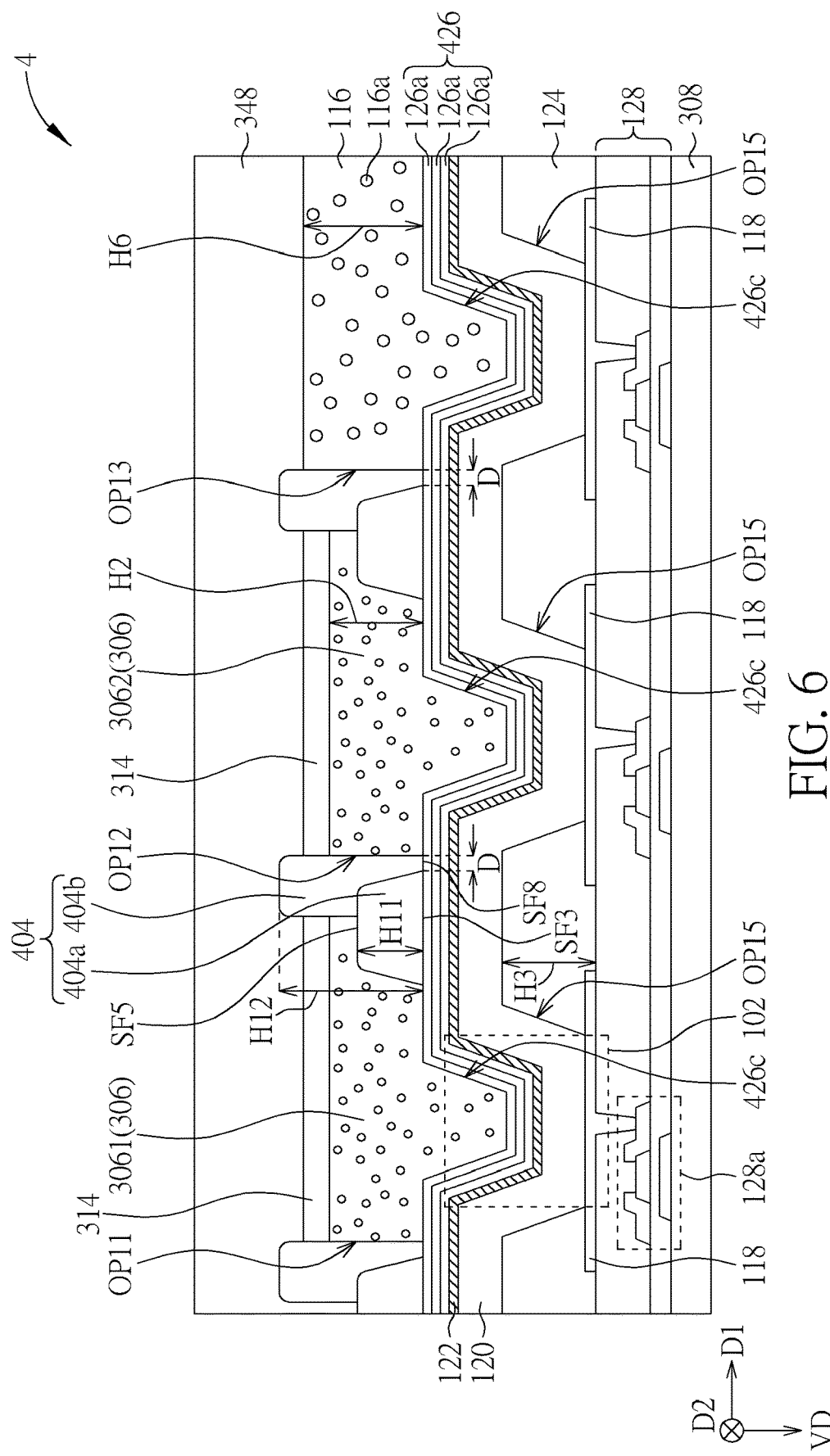
FIG. 6 schematically illustrates a cross-sectional view of the light emitting device according to the third embodiment of the present disclosure.

FIG. 6 schematically illustrates a cross-sectional view of a light emitting device according to a third embodiment of the present disclosure. As shown in FIG. 6, the difference between the light emitting device 4 of the present embodiment and the light emitting device of the second embodiment shown in FIG. 5 is that the second sub-layer 404b of the partition wall 404 may not be completely disposed on the surface SF5 of the first sub-layer 404a. In the present embodiment, the second sub-layer 404b may be in contact with the protection layer 426. For example, the second sub-layers 404b located at two sides of the opening OP11, two sides of the opening OP12 and two sides of the opening OP13 may be shifted toward the same direction, such as the first direction D1 or the direction opposite to the first direction D1. Accordingly, in the top view direction VD, a distance D is included between the endpoint of the second sub-layer 404b contacting the protection layer 426 and the endpoint of the first sub-layer 404a contacting the protection layer 426 and adjacent to the same opening (such as the opening OP12) as the endpoint of the second sub-layer 404b. In some embodiments, each of the distances D may be the same, such that the size of the opening OP11, the size of the opening OP12 and the size of the opening OP13 may be the same. Alternatively, at least two of the distances D may be different from each other, such that the size of the opening OP11, the size of the opening OP12 and the size of the opening OP13 may be different. In some embodiments, the distance D may be a positive value or a negative value, that is, the shifted direction of the second sub-layer 404b relative to the corresponding first sub-layer 404a may be the first direction D1 (positive value) or the direction opposite to the first direction D1 (negative value). The size of the opening OP11, the size of the opening OP12 and the size of the opening OP13 may be adjusted by adjusting the distance D and/or adjusting the shifted direction of the second sub-layer 404b relative to the corresponding first sub-layer 404a, therefore, the aperture ratio of the sub pixels may be adjusted, thereby adjusting the chromaticity of white light displayed by the light emitting device 4. In some embodiments, the second sub-layer 404b located at one side of one of the opening OP11, the opening OP12 and the opening OP13 may completely be located above the first sub-layer 404a, and the surface SF8 of the second sub-layer 404b located at another side of the one of the opening OP11, the opening OP12 and the opening OP13 that is close to the substrate 308 may be in contact with the protection layer 426.

The light emitting device 4 of the present embodiment may not include the hydrophobic layer 350, the scattering layer 344 and the light scattering layer 346, but not limited thereto. In some embodiments, the light emitting device 4 may optionally include at least one of the hydrophobic layer 350, the scattering layer 344 and the light scattering layer 346. In the present embodiment, the protection layer 426 may include the stack of the plurality of inorganic material layers 126a, but not limited thereto. Because the inorganic material layers 126a do not have leveling function, and the thickness of each of the inorganic material layers 126a is nearly uniform, the surface of the protection layer 426 may include a plurality of cavities 426c according to the ups and downs of the pixel defining layer 124, and each of the cavities 426c may correspond to an opening OP15. In addition, the light conversion element 306 and the light scattering layer 116 would fill up the corresponding cavity 426c respectively. In some embodiments, any one of the protection layers mentioned above may be used as the protection layer 426. In the present embodiment, the thickness H2 of the light conversion element 306 may for example be the distance from the surface of the protection layer 426 outside the cavity 426c to the surface of the light conversion element 306. Similarly, the thickness H6 of the light scattering layer 116 may for example be the distance from the surface of the protection layer 426 outside the cavity 426c to the surface of the light scattering layer 116.

Figure 7:
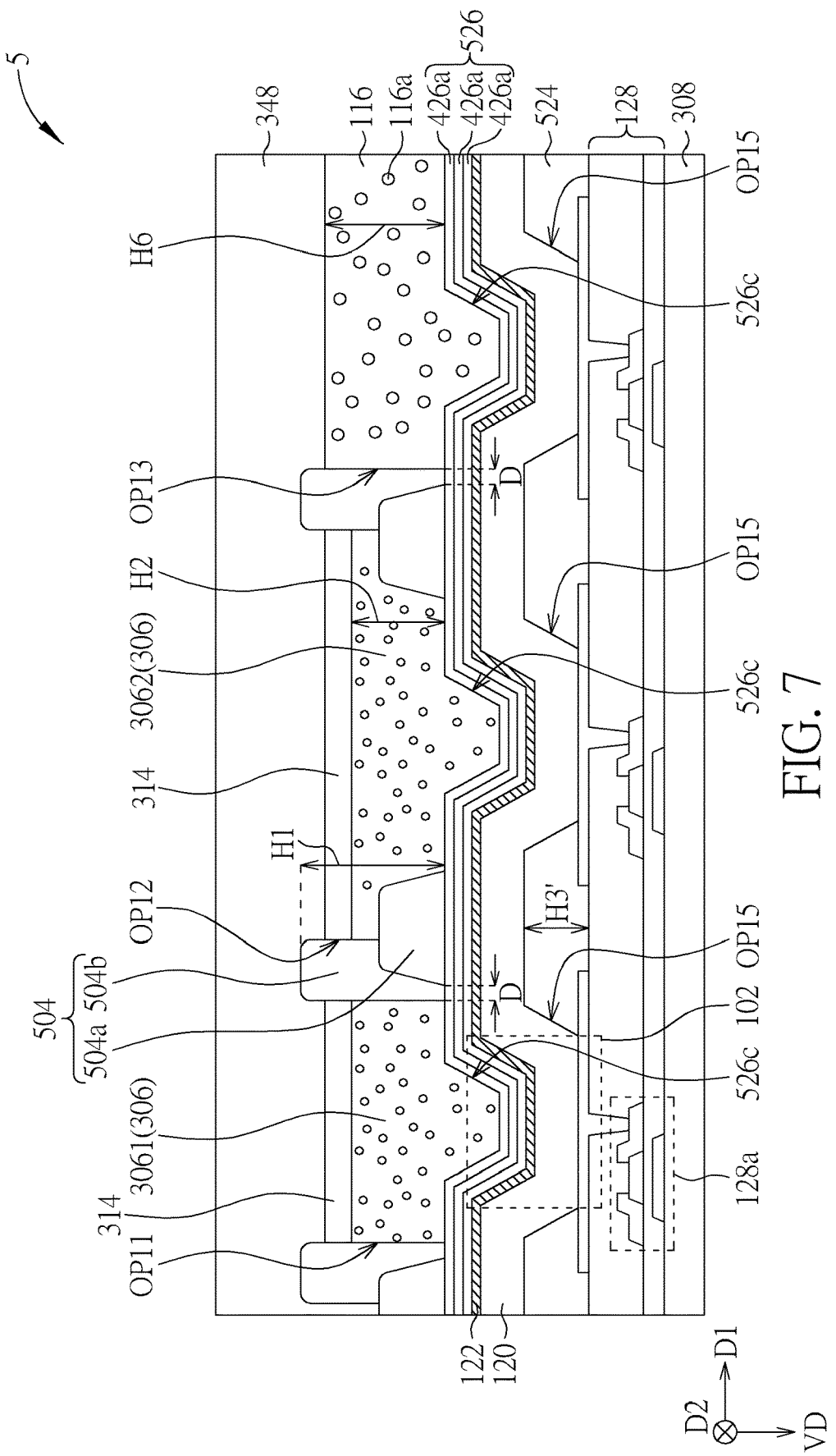
FIG. 7 schematically illustrates a cross-sectional view of the light emitting device according to a variant embodiment of the third embodiment of the present disclosure.

FIG. 7 schematically illustrates a cross-sectional view of a light emitting device according to a variant embodiment of the third embodiment of the present disclosure. As shown in FIG. 7, the difference between the light emitting device 5 of the present embodiment and the light emitting device of the third embodiment shown in FIG. 6 is that the second sub-layers 504b located at two sides of the opening may be shifted toward different directions, for example, may be shifted toward the first direction D1 and the direction opposite to the first direction D1 respectively. Accordingly, the size of the opening OP11, the size of the opening OP12 and the size of the opening OP13 may be different. For example, the second sub-layers 504b located at two sides of the opening OP11 may be shifted toward the inner side of the opening OP11, and the second sub-layers 504b located at two sides of the opening OP12 may be shifted toward the outer side of the opening OP12. Therefore, the size of the opening OP11 may be less than the size of the opening OP12, such that the aperture ratio of the sub pixel corresponding to the opening OP11 may be less than the aperture ratio of the sub pixel corresponding to the opening OP12, thereby adjusting the chromaticity of white light displayed by the light emitting device 5.

In the present embodiment, the thickness H3' of the pixel defining layer 524 may be less than the thickness H3 of the pixel defining layer 124 shown in FIG. 6. It is worthy noted that because the protection layer 426 shown in FIG. 6 includes the stack of the plurality of inorganic material layers 126a, the cavities 426c may be included on the surface of the protection layer 426, such that the partition wall 304 may be easily affected by the cavities 426c to be broken or cracked during forming the partition wall 304 on the protection layer 426. In the present embodiment, by reducing the thickness H3' of the pixel defining layer 524, the depth of the cavities 526c of the protection layer 526 may be reduced, thereby reducing the possibility of breakage of the partition wall 504. The thickness H3' of the pixel defining layer 524 may for example be the distance H3' from the surface where the pixel defining layer 524 contacts the thin film transistor layer 128 to the surface of the pixel defining layer 524. For example, the thickness H3' of the pixel defining layer 524 may be less than the thickness H1 (that is, the entire thickness of the first sub-layer 504a and the second sub-layer 504b) of the partition wall 504. In some embodiment, when the light emitting element 102 is the inorganic light emitting diode, the thickness H3' of the surface of the pixel defining layer 524 may be less than the thickness of the surface of the light emitting diode, but not limited thereto.

Figure 8:
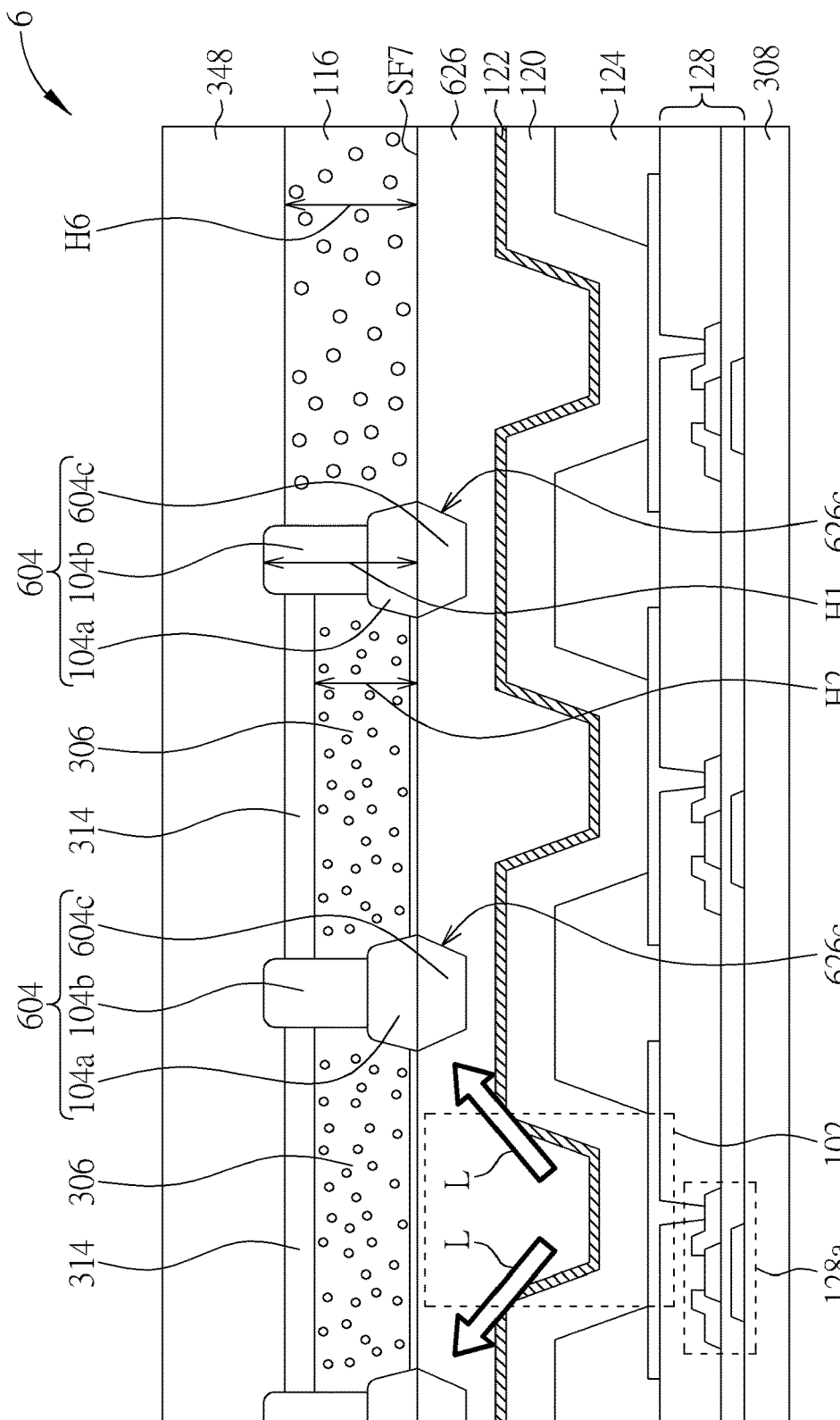
FIG. 8 schematically illustrates a cross-sectional view of the light emitting device according to the fourth embodiment of the present disclosure.

FIG. 8 schematically illustrates a cross-sectional view of a light emitting device according to a fourth embodiment of the present disclosure. As shown in FIG. 8, the difference between the light emitting device 6 of the present embodiment and the light emitting device of the second embodiment shown in FIG. 5 is that the protection layer 626 may include cavities 626c, and the partition wall 604 further includes a third sub-layer 604c disposed in the cavity 626c. It is worthy noted that through the disposition of the third sub-layer 604c, the possibility of transmission of the light L generated by the light emitting element 102 to the adjacent openings may be reduced, thereby reducing color mixing of the adjacent sub pixels. The cavities 626c may not penetrate through any layer in the protection layer 626 or may penetrate through at least one layer in the protection layer 626. In the method of manufacturing the light emitting device 6 of the present embodiment, the cavities 626c of the protection layer 626 may be formed before the step of coating the insulating layer used to form the third sub-layer 604c, and then, the third sub-layer 604c may be formed in the cavities 626c. After the third sub-layer 604c is formed, the first sub-layer 104a and the second sub-layer 104b may be formed in sequence to form the partition wall 604. The steps after the formation of the partition wall 604 of the present embodiment may be similar to or the same as the steps of the second embodiment shown in FIG. 5, and will not be redundantly described here. In some embodiments, the multi-layer structure of the protection layer 626 may adopt any one of the protection layers mentioned above. In the present embodiment, because the third sub-layer 604c is filled into the cavity 626c, the thickness H1 of the partition wall 604 may for example be the distance from the surface SF7 of the protection layer 626 outside the cavity 626c to the surface of the second sub-layer 104b.

Figure 9:
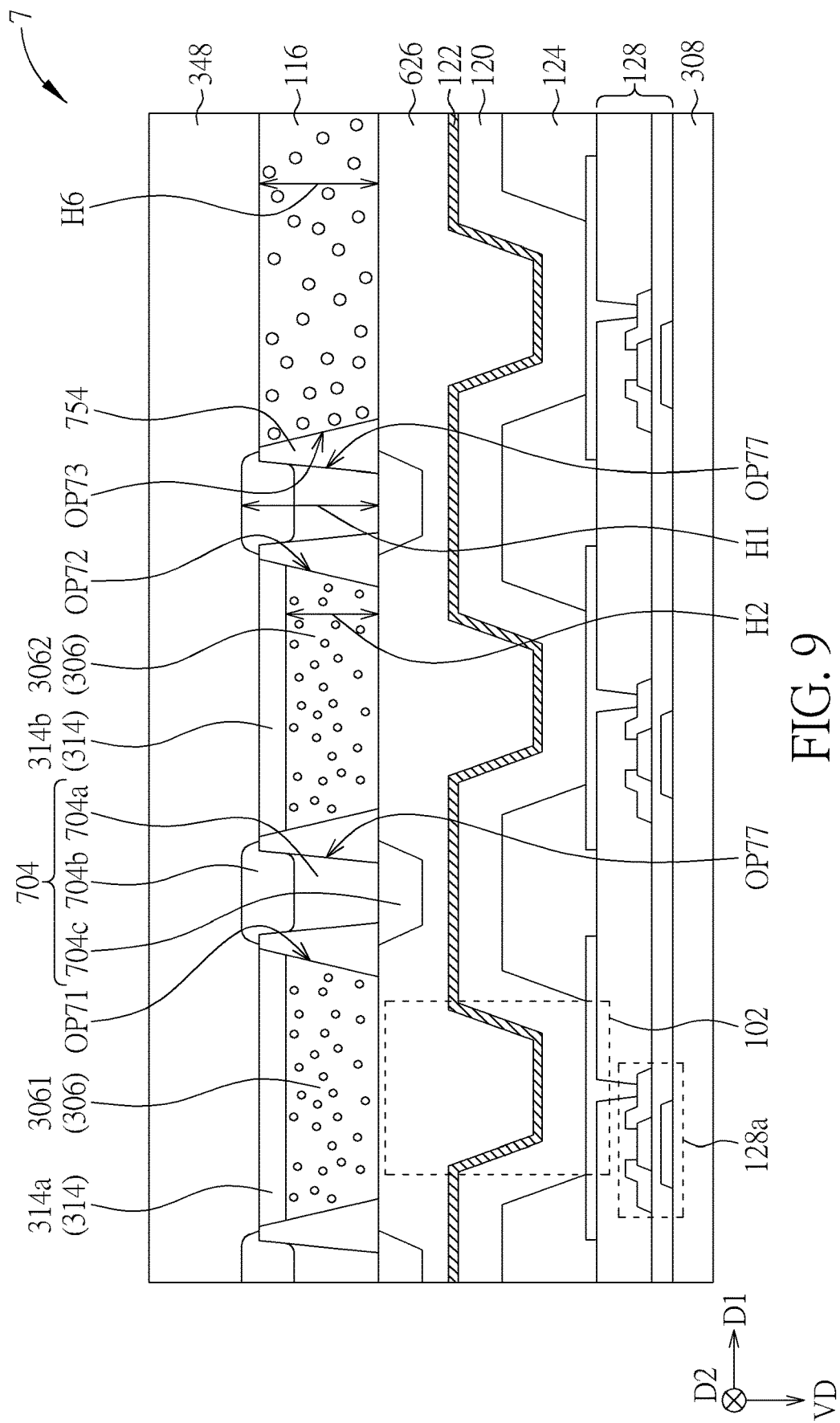
FIG. 9 schematically illustrates a cross-sectional view of the light emitting device according to the fifth embodiment of the present disclosure.

FIG. 9 schematically illustrates a cross-sectional view of the light emitting device according to the fifth embodiment of the present disclosure. As shown in FIG. 9, the difference between the light emitting device 7 of the present embodiment and the light emitting device of the fourth embodiment shown in FIG. 6 is that the light emitting device 7 may further include another protection layer 754 disposed on the protection layer 626. In the present embodiment, the protection layer 754 may include an opening OP71, an opening OP72 and an opening OP73, the light conversion element 3061 is disposed in the opening OP71, the light conversion element 3062 is disposed in the opening OP72, and the light scattering layer 116 is disposed in the opening OP73. In the method of manufacturing the light emitting device 7 of the present embodiment, after the cavities 626c are formed, the third sub-layer 704c may be filled into the cavities 626c of the protection 626, and the third sub-layer 704c may be one sub-layer of the partition wall 704. Then, another protection layer 754 may be formed on the protection layer 626 and the third sub-layer 704c. After that, the opening OP71, the opening OP72, the opening OP73 and the opening OP77 may be formed between the protection layers 754, in which the opening OP77 may be disposed on the third sub-layer 704c. The opening OP71, the opening OP72 and the opening OP73 may respectively be disposed on the corresponding one of the light emitting elements 102. Then, the light conversion element 3061, the light conversion element 3062 and the scattering layer 116 are respectively filled into the opening OP71, the opening OP72 and the opening OP73, and the first sub-layer 704a and the second sub-layer 704b are filled into the corresponding opening OP77. The filling order of the light conversion element 3061, the light conversion element 3062, the light scattering layer 116, the first sub-layer 704a and the second sub-layer 704b may be replaced, exchanged, or determined according to the heat resistances of the materials thereof, but not limited thereto. The advantage of the above-mentioned structure is that the thickness of the formed partition wall 704 may be higher than the thickness of the light conversion element 3061, the thickness of the light conversion element 3062 and the thickness of the light scattering layer 116, thereby reducing the overflow of the light conversion ink and preventing color mixing. The third sub-layer 704c may reduce the transmission of the light L generated from the light emitting element 102 to the adjacent opening. Besides, the light conversion element 3061, the light conversion element 3062 and the light scattering layer 116 respectively disposed in the opening OP71, the opening OP72 and the opening OP73 of the protection layer 754 may be surrounded by the protection layer 754, thereby improving the ability of moisture isolation and oxygen isolation of the light conversion element 3061, the light conversion element 3062 and the light scattering layer 116 to effectively protect the light conversion element 3061, the light conversion element 3062 and the light scattering layer 116.

Figure 10:
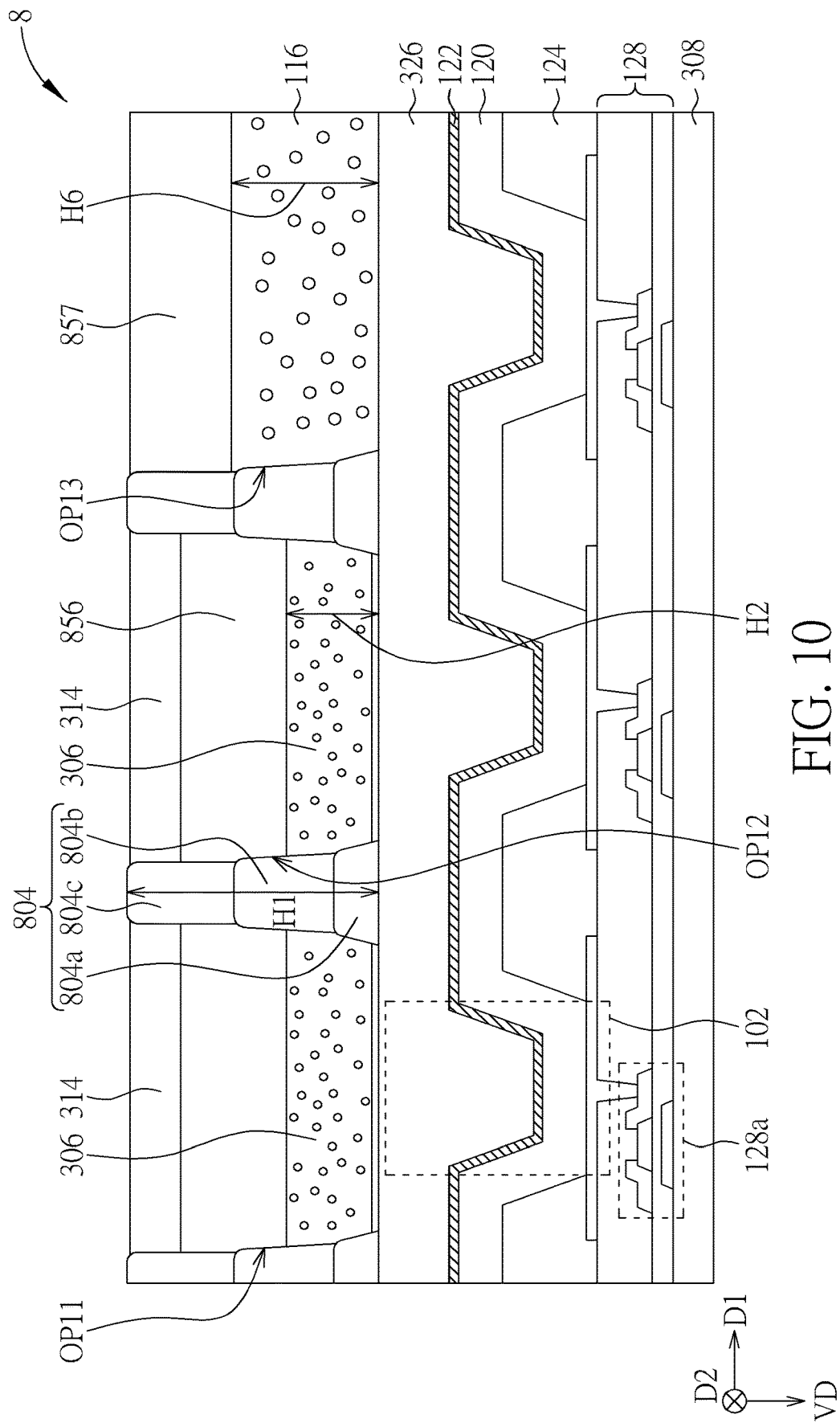
FIG. 10 schematically illustrates a cross-sectional view of the light emitting device according to the sixth embodiment of the present disclosure.

FIG. 10 schematically illustrates a cross-sectional view of a light emitting device according to a sixth embodiment of the present disclosure. As shown in FIG. 10, the difference between the light emitting device 8 of the present embodiment and the light emitting device of the second embodiment shown in FIG. 5 is that a protection layer 856 is disposed between the light blocking layer 314 and the light conversion element 306 to reduce the diffusion of the solvent material of the light blocking layer 314 into the light conversion element 306 to destroy the light conversion material. For example, the light blocking layer 314 may include color filter, and the solvent material of the color filter may destroy the quantum dot material. Accordingly, the condition that the quantum dot material is destroyed by the solvent of the color filter may be reduced by disposing the protection layer 856 between the light blocking layer 314 and the light conversion element 306. For example, the protection layer 856 may adopt the structure of any protection layer mentioned above, such as the plurality of organic material layers and the plurality of inorganic material layers which are alternately stacked or the stack of the plurality of inorganic material layers. In the present embodiment, the partition wall 804 may include three sub-layers 804a, 804b and 804c, such that the partition wall 804 may have enough thickness, and the light conversion element 306, the protection layer 856 and the light blocking layer 314 may be filled into the opening OP11 and the opening OP12. Besides, in the opening OP13, another protection layer 857 may be disposed on the light scattering layer 116. The protection layer 857 may also adopt the structure of any protection layer mentioned above.

Figure 11:
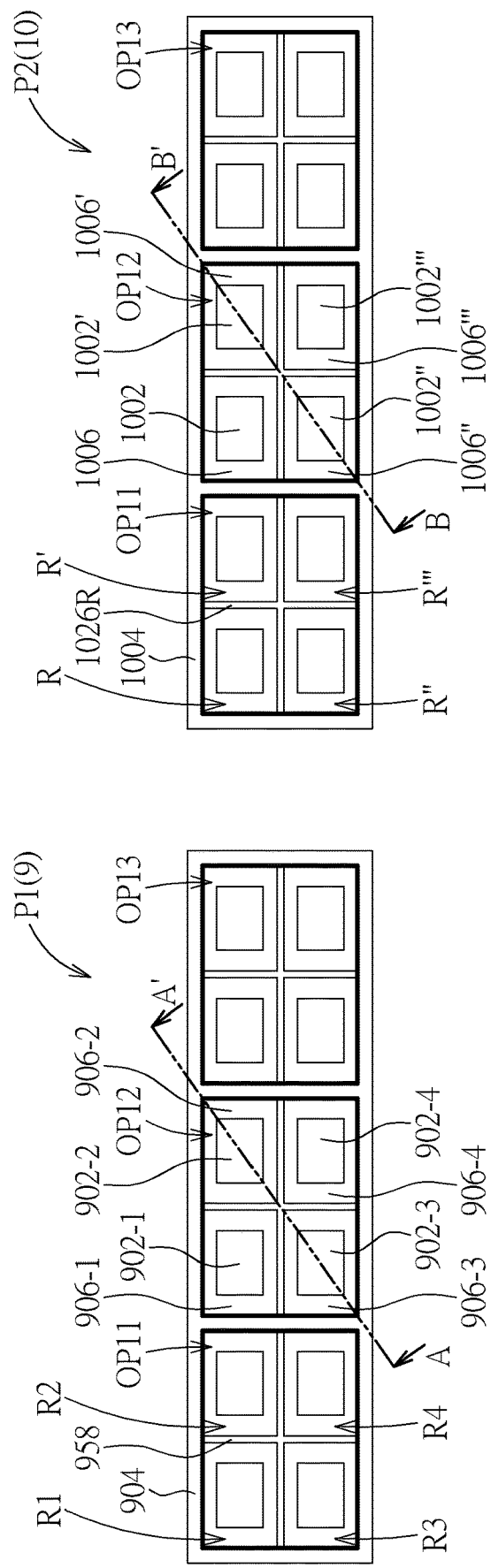
FIG. 11 schematically illustrates the top views of light emitting devices according to different variant embodiments of the seventh embodiment of the present disclosure.
Figure 12:
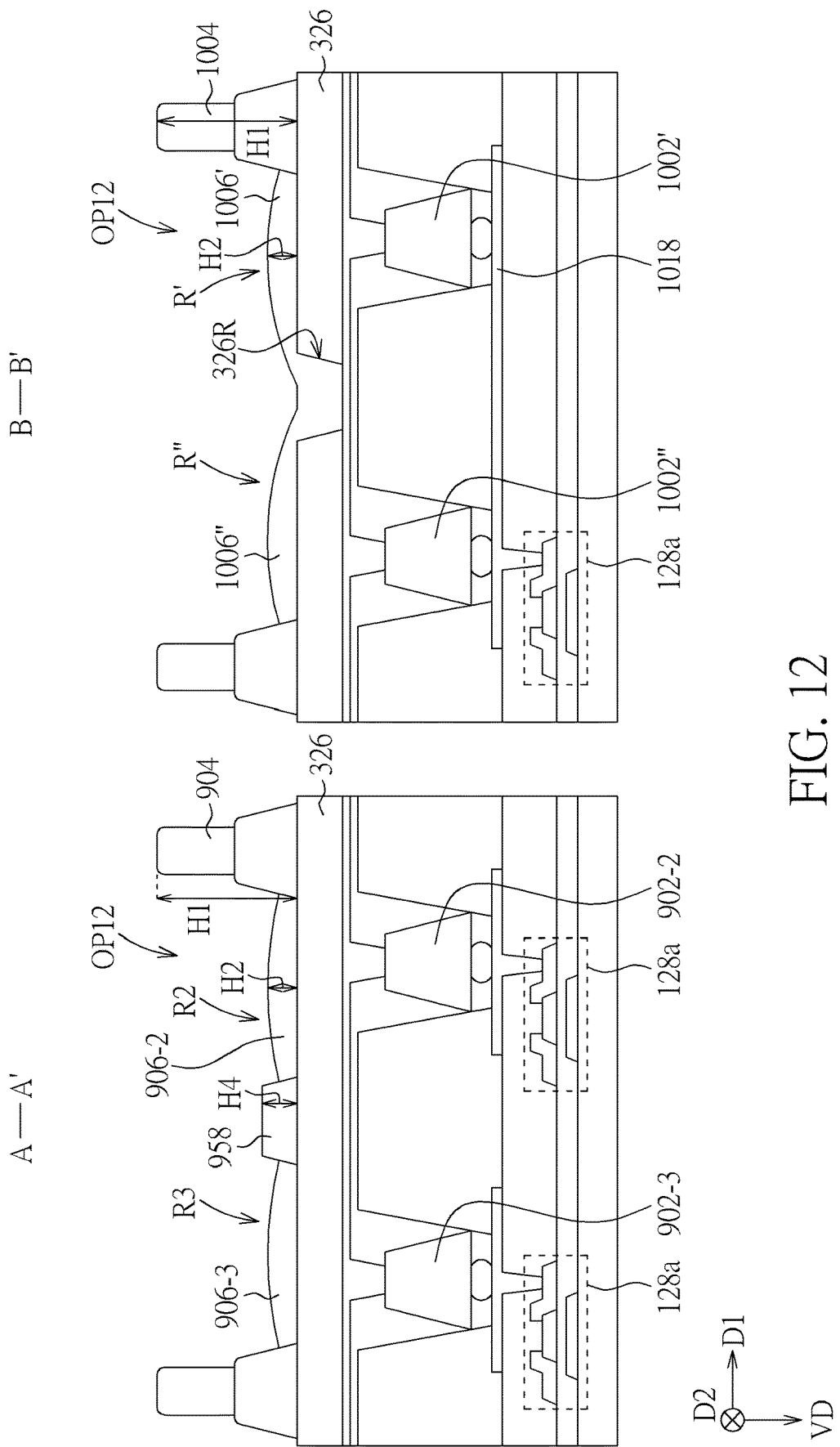
FIG. 12 schematically illustrates the cross-sectional views along the line A-A' and B-B' shown in FIG. 11.

FIG. 11 schematically illustrates top views of light emitting devices according to different variant embodiments of the seventh embodiment of the present disclosure, and FIG. 12 schematically illustrates cross-sectional views respectively along a line A-A' and a line B-B' shown in FIG. 11. As shown in the portion P1 of FIG. 11 and the portion corresponding to line A-A' of FIG. 12, the difference between the variant embodiment of the present embodiment and the second embodiment is that the light emitting device 9 may further include a plurality of partition structures 958 respectively disposed in the corresponding opening OP11, the opening OP12 and the opening OP13. The partition structures 958 may include the same light shielding material as the partition wall 904, but not limited thereto. Specifically, each of the opening OP11, the opening OP12 and the opening OP13 of the partition wall 904 of the present variant embodiment may correspond to a plurality of light emitting elements, that is, corresponding to a plurality of sub pixels. In the present variant embodiment, each of the opening OP11, the opening OP12 and the opening OP13 corresponding to four light emitting elements 902-1, 902-2, 902-3 and 902-4 arranged in an array may be taken as an example. Each of the opening OP11, the opening OP12 and the opening OP13 may be divided into four regions R1, R2, R3 and R4 by the partition structure 958 to form four cavities on the protection layer 326, and the light emitting element 902-1, the light emitting element 902-2, the light emitting element 902-3 and the light emitting element 902-4 are respectively located in the corresponding regions R1, R2, R3 and R4 in the top view direction VD.

For example, the thickness H4 of the partition structure 958 may be less than the thickness H1 of the partition wall 904, or the thickness H4 of the partition structure 958 may be higher than the thickness H2 of the light conversion element. Through the partition structure 958, the light conversion elements in each of the opening OP11, the opening OP12 and the opening OP13 may be divided into four portions 906-1, 906-2, 906-3 and 906-4 respectively located above the corresponding light emitting elements 902-1, 902-2, 902-3 and 902-4 and respectively corresponding to the sub pixels with the same color. In the present variant embodiment, the portions 906-1, 906-2, 906-3 and 906-4 of the light conversion element may be separated from each other, but not limited thereto. In addition, the light emitting elements 902-1, 902-2, 902-3 and 902-4 corresponding to the same opening OP11, the opening OP12 or the opening OP13 may be respectively electrically connected to the corresponding driving element 128a to be served as a plurality of sub pixels, that is, one driving element 128a may correspond to one sub pixel, thereby improving the resolution of the light emitting device 9.

In the method of manufacturing the light emitting device 9 of the present variant embodiment, the partition structure 958 may be formed before, after or simultaneously with the partition wall 904. Then, the light conversion ink may be dropped into the corresponding opening OP11 and the opening OP12 through inkjet printing process. Through the disposition of the partition structure 958, the dropped light conversion ink may flow into the cavities of the corresponding regions R1, R2, R3 and R4, thereby being divided into four portions. Accordingly, the light conversion element may be filled into a single opening OP11 or opening OP12 at one time instead of being filled into the single opening OP11 or opening OP12 multiple times, such that the time of inkjet printing may be saved.

As shown in the portion P2 of FIG. 11 and the portion corresponding to line B-B' of FIG. 12, the difference between another variant embodiment of the present embodiment and the variant embodiment mentioned above is that the protection layer 326 may include a plurality of cavities 326R respectively corresponding to one of the opening OP11, the opening OP12 and the opening OP13. Each of the opening OP11, the opening OP12 and the opening OP13 may be divided into a plurality of regions R, R', R" and R''' by the cavity 326R, and the regions R, R', R" and R''' respectively correspond to the light emitting elements 1002, 1002' and 1002" in each of the opening OP11, the opening OP12 and the opening OP13. Through the disposition of the cavity 326R, the light conversion ink dropped into the openings may be divided into four portions using the cavity 326R as the boundary. In the present embodiment, the portion 1006', 1006", 1006''' and 1006'''' located in the same opening OP11, the same opening OP12 or the same opening OP13 may be filled into the cavity 326R and connected to each other.

In addition, in the present variant embodiment, the light emitting elements 1002, 1002', 1002" and 1002''' in the same opening OP11, the same opening OP12 or the same opening OP13 may be electrically connected to the same driving element 128a, such that the light emitting elements 1002, 1002', 1002" and 1002''' may be driven with small amount of current, thereby reducing the problem of screen burn-in or improving lifespan of the light emitting elements 1002, 1002', 1002" and 1002'. For example, the light emitting elements 1002, 1002', 1002" and 1002''' may be electrically connected to the driving element 128a through the same pixel electrode 1018, but not limited thereto. The light emitting elements 1002, 1002', 1002" and 1002''' may also be electrically connected to the same driving element 128a through different pixel electrodes.

In some embodiments, the portion P1 of the partition structure 958 may be replaced by the cavity 326R of the second portion P2. In some embodiments, the cavity 326R of the portion P2 may be replaced by a portion of the partition structure 958. In some embodiment, regardless of the partition structure 958 or the cavity 326R, the surface of each of the portions 906-1, 906-2, 906-3 and 906-4 or the surface of each of the portions 1006', 1006", 1006''' and 1006'''' of the light conversion element formed after baking process may include arc shape, such that the surface of each of the portions 906-1, 906-2, 906-3 and 906-4 or the surface of each of the portions 1006', 1006", 1006''' and 1006'''' may match the optical demands.

FIG. 13 schematically illustrates a cross-sectional view of a light emitting device according to an eighth embodiment of the present disclosure, and FIG. 14 schematically illustrates top views of the light emitting devices respectively corresponding to a single opening according to different variant embodiments of the eighth embodiment of the present disclosure. For clear description, the protection layer, the thin film transistor layer and the light blocking layer are omitted in FIG. 13, but not limited thereto. The difference between the light emitting device 13 of the present embodiment and the light emitting device of the second embodiment is that the light emitting device 13 further includes an auxiliary planarization layer 1360 disposed on the pixel defining layer 124 and located in the opening OP of the partition wall 304. The thickness H5 of the auxiliary planarization layer 1360 may be less than the thickness H2 of the light conversion element 306. Because the light conversion ink injected into the opening OP have fluidity when it is a non-solidified wet film and before the baking process, by disposing the auxiliary planarization layer 1360 in the opening OP, the overflow of light conversion ink out of the partition wall 304 may be mitigated when the oblique is occurred during the dropping of the light conversion ink into the opening OP, and when the light conversion ink is not solidified and has fluid property the auxiliary planarization layer 1360 may help the light conversion ink filled into the opening OP with an uniform thickness to improve the uniformity of thickness of the baked light conversion element 306. Accordingly, the surface of the formed light conversion element 306 may be flatter, and the flattened light conversion unit 306 may have more uniform optical effect. The portion of the auxiliary planarization layer 1360 at least disposed on the light emitting element 102 may for example include transparent material, but not limited thereto. The surface of the light conversion element 306 may be roughly flat, but not limited thereto. In some embodiments, the surface of the light conversion element 306 may also be arc-shaped. The cross-sectional shape of the auxiliary planarization layer 1360 is not limited to trapezoid.

As shown in the portion P3 of FIG. 14, in the top view direction VD, the auxiliary planarization layer 1360 may include a plurality of string portions 1360a respectively extending along the second direction D2. As shown in the portion P4 of FIG. 14, in the top view direction VD, the auxiliary planarization layer 1360 may include a plurality of string portions 1360b respectively extending along the first direction D1. As shown in the portion P5 of FIG. 14, in the top view direction VD, the auxiliary planarization layer 1360 may include a plurality of string portions 1360a and a plurality of string portions 1360b, and the string portions 1360a and the string portions 1360b cross each other to form a grid structure. The first direction D1 and the second direction D2 of the present embodiment may be perpendicular to each other, but not limited thereto. In some embodiments, the extending direction of the string portion 1360a may not be perpendicular to the extending direction of the string portion 1360b. It is worthy noted that when the corner of the opening OP of the partition wall 304 is a right angle in the top view direction VD, the light conversion ink may not be easily filled into the corners of the opening OP, such that the vacancy which is not filled with the light conversion ink may be easily produced, and the colors of the sub pixels may be below expectation. In the present embodiment, because the corners OPc of the opening OP of the partition wall 304 has arc shape in the top view direction VD, the vacancy produced because the light conversion ink is not filled up the corners OPc of the opening OP may be reduced.

Figure 15:
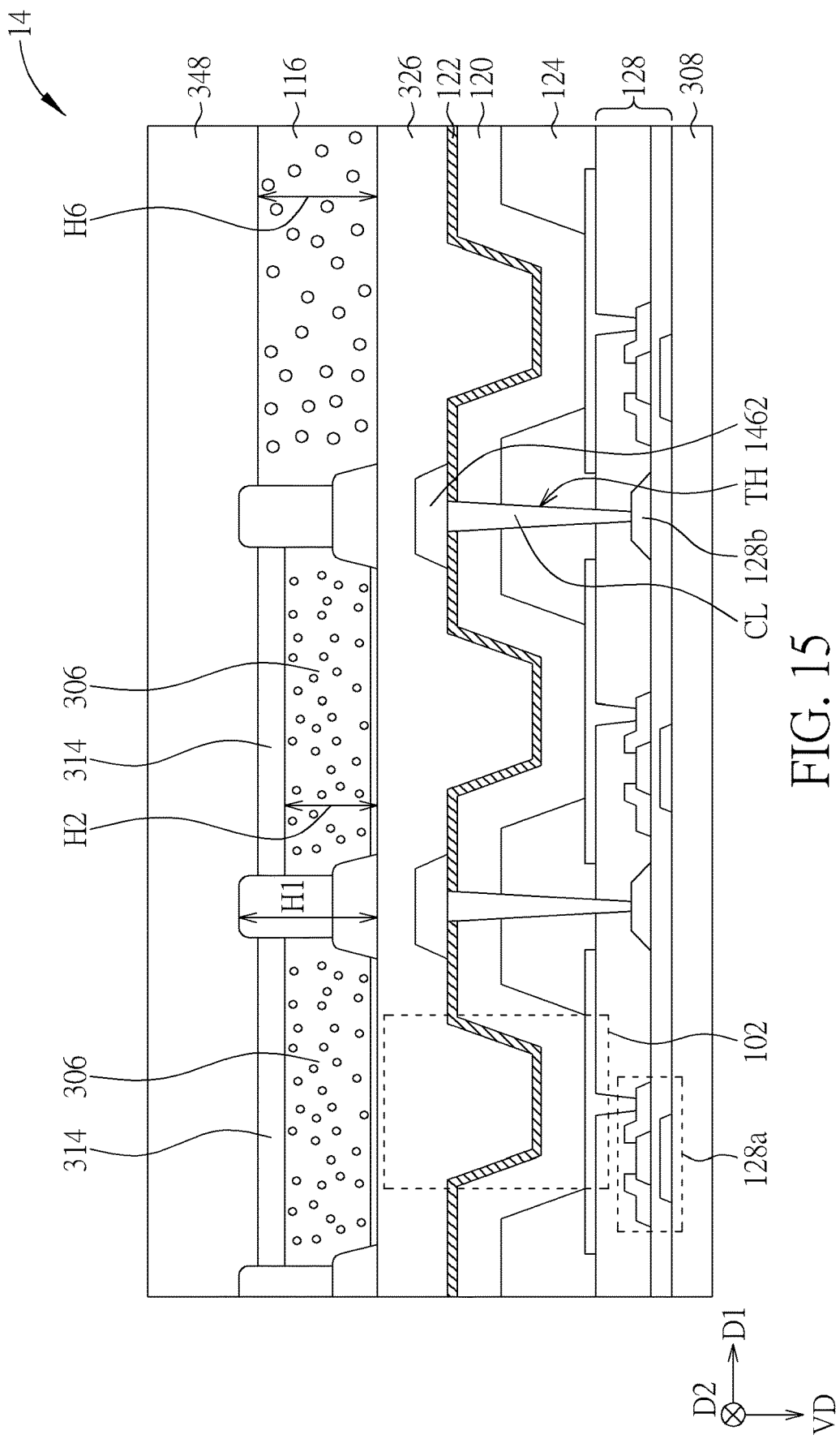
FIG. 15 schematically illustrates a cross-sectional view of the light emitting device according to the ninth embodiment of the present disclosure.

FIG. 15 schematically illustrates a cross-sectional view of a light emitting device according to a ninth embodiment of the present disclosure. As shown in FIG. 15, the difference between the light emitting device 14 of the present embodiment and the light emitting device of the second embodiment shown in FIG. 5 is that the light emitting device 14 further includes an auxiliary electrode 1462 to reduce the difference of the resistance between the common electrode 122 of the light emitting element 102 and an external voltage source or a peripheral circuit. Specifically, the auxiliary electrode 1462 is disposed between the common electrode 122 and the protection layer 326, located below the partition wall 304, and overlapped with the partition wall 304. For example, the auxiliary electrode 1462 may have grid shape in the top view direction VD. It is worthy noted that in order to improve the brightness of output light of the light emitting element 102, the thickness of the common electrode 122 needs to be less. Accordingly, by means of the disposition of the auxiliary electrode 1462, the resistances from the external voltage source or the peripheral circuit to the common electrode 122 corresponding to different light emitting elements 102 may be reduced or uniformed. In some embodiments, the material of the auxiliary electrode 1462 may include magnesium silver layer, nano-silver glue or other suitable conductive materials. In some embodiments, the material of the auxiliary electrode 1462 may be the same as the common electrode 122, but not limited thereto.

In the present embodiment, the thin film transistor layer 128 of the light emitting device 14 may further include a plurality of conductive lines 128b. In addition, before the auxiliary electrode 1462 is formed, a through hole TH may be formed in the thin film transistor layer 128, the pixel defining layer 124 and the organic layer 120. For example, the through hole TH may be formed by laser drilling. Then, the conductive layer CL may be filled into the through hole TH, such that the auxiliary electrode 1462 formed on the conductive layer CL may be electrically connected to the conductive lines 128b through the conductive layer CL, thereby further reducing the resistance. Because the conductive layer CL is located below the partition wall 304, when the conductive layer CL is capacitively coupled to the pixel electrode 118, such that the organic layer 120 adjacent to the conductive layer CL generates light, the partition wall 304 may be used to shield the leaked light.

Figure 16:
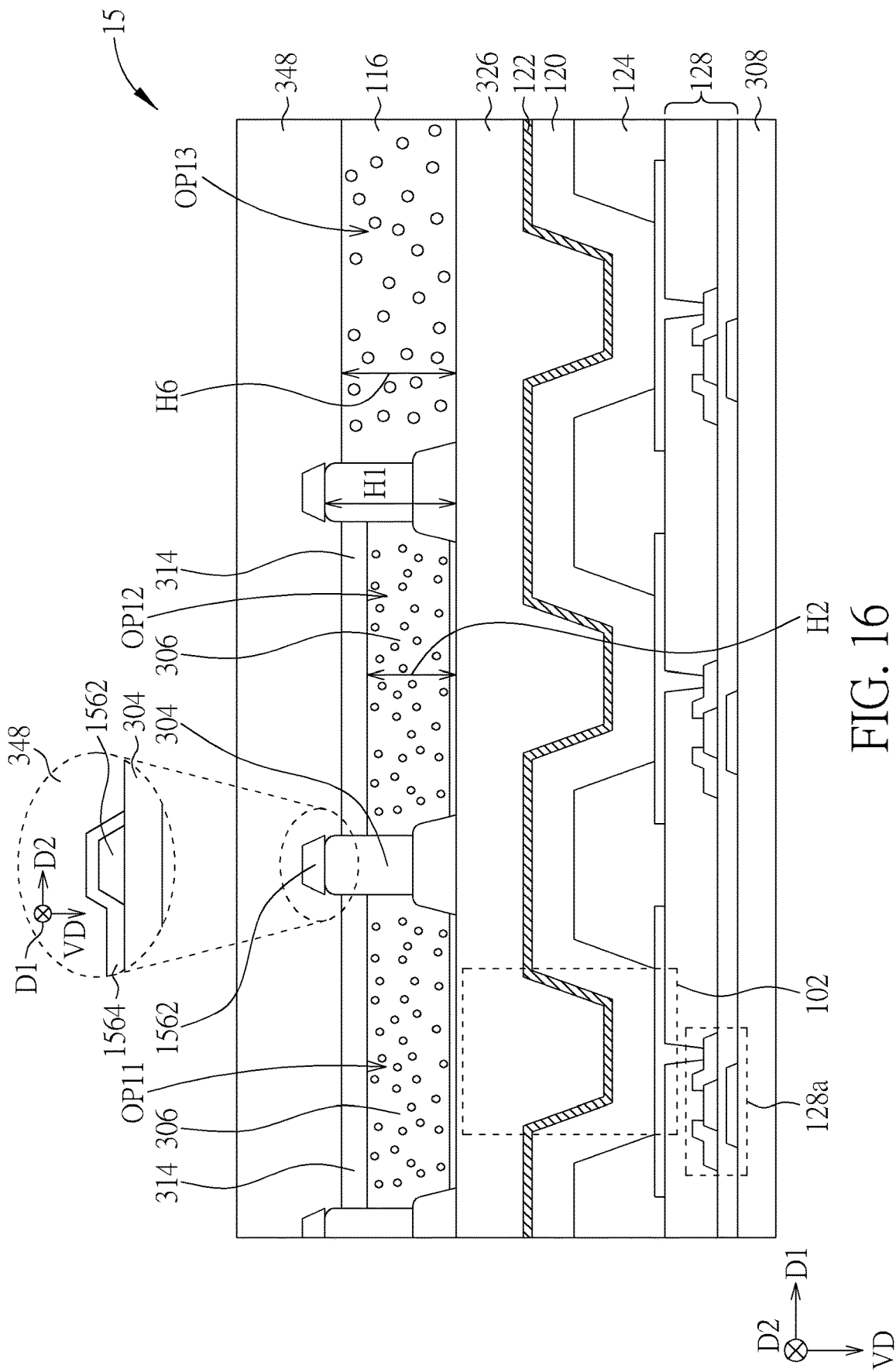
FIG. 16 schematically illustrates a cross-sectional view of the light emitting device according to a variant embodiment of the ninth embodiment of the present disclosure.

FIG. 16 schematically illustrates a cross-sectional view of a light emitting device according to a variant embodiment of the ninth embodiment of the present disclosure. As shown in FIG. 16, the difference between the light emitting device 15 of the present embodiment and the light emitting device of the ninth embodiment shown in FIG. 15 is that the auxiliary electrode 1562 is disposed on the partition wall 304 in the present variant embodiment. In addition, the light emitting device 15 may further include at least one connection line 1564 disposed above the partition wall 304 to electrically connect the auxiliary electrode 1562 and the common electrode 122 in the peripheral region (not show) of the light emitting device 15. The peripheral region may for example be the region for disposing the peripheral circuit, but not limited thereto. In order to clearly show the connection line 1564, the upper part of FIG. 16 shows an enlarged schematic view of the connection line 1564, the auxiliary electrode 1562, and the partition wall 304, and the coordinate or orientation of the upper part may be different from the coordinate or orientation of the lower part. For example, the connection line 1564 may be disposed on the partition wall 304 along the second direction D2 and extend onto the auxiliary electrode 1562 but not cross the opening OP11, the opening OP12 and the opening OP13. The connection line 1564 may for example include metal conductive materials such as aluminum, copper or gold, but not limited thereto. In some embodiments, the connection line 1564 may extend to be located between the auxiliary electrode 1562 and the partition wall 304. In some embodiments, the material of the connection line 1564 may include aluminum, copper, silver, gold, or other suitable conductive materials.

Figure 17:
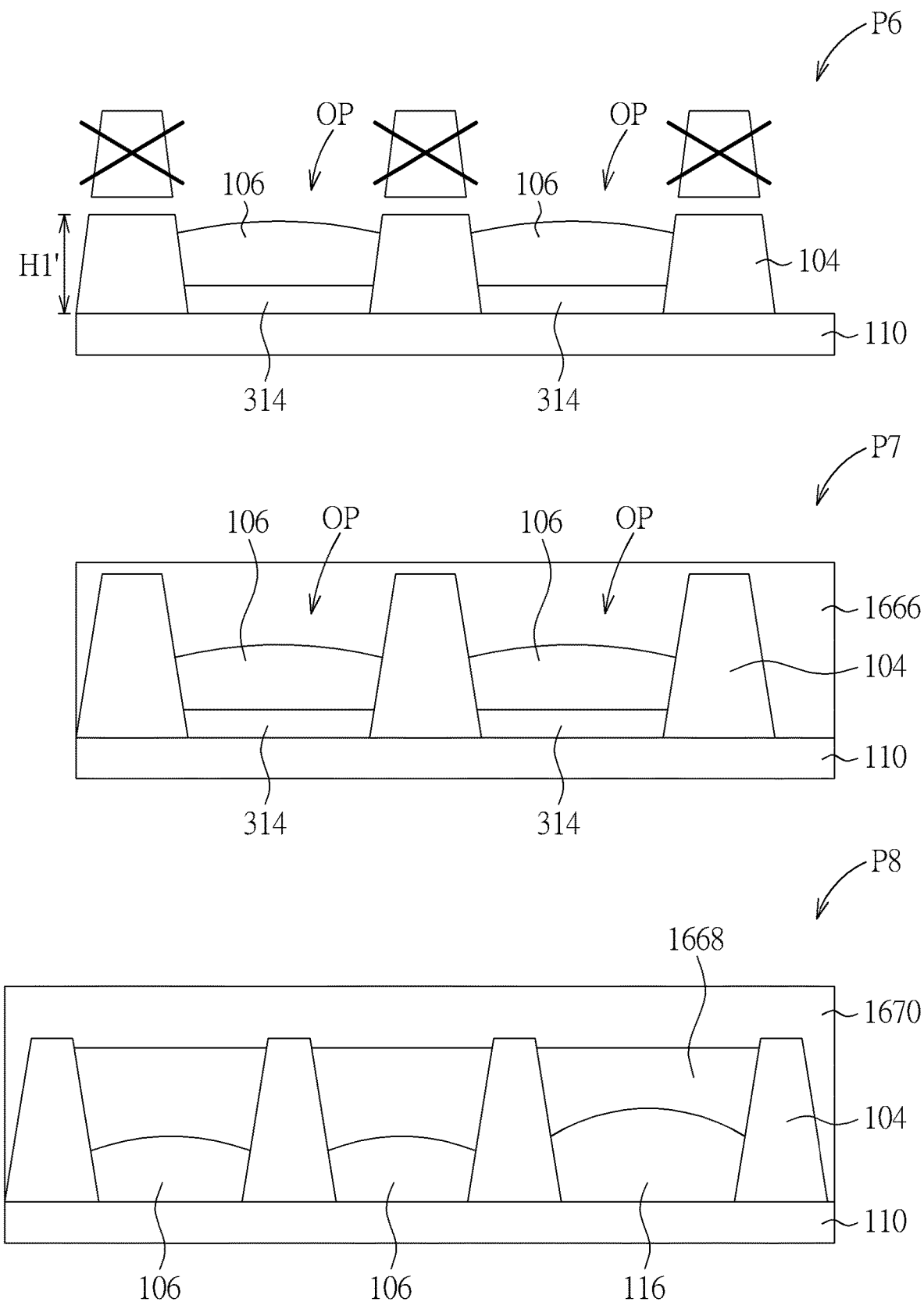
FIG. 17 schematically illustrates the method of manufacturing the partition wall and the layers on the substrate according to different variant embodiments of the tenth embodiment of the present disclosure.

FIG. 17 schematically illustrates a method of manufacturing the partition wall and the layers on the substrate according to different variant embodiments of a tenth embodiment of the present disclosure. As shown in the portion P6 of FIG. 17, in the method of one of the variant embodiments of the present embodiment, after the light conversion element 106 is formed by solidification, a grinding process may be performed to remove the portion of the partition wall 104 which is excessive high. Accordingly, the thickness H1' of the partition wall 104 may be reduced to shorten the path of the light. After that, the light blocking layer, the reflective layer, the protection layer, the planarization layer and/or the encapsulation layer (not shown) may be formed on the partition wall 104 in sequence.

As shown in the portion P7 of FIG. 17, in the method of another one variant embodiment of the present embodiment, after the light conversion element 106 is formed, the opening OP of the partition wall 104 may be filled with a filling layer 1666, and the filling layer 1666 may cover the partition wall 104, such that the surface may be flattened. The filling layer 1666 may be formed by silicon nano coating, and thus, the opening OP may be fully filled. Through this method, the light conversion element 106 may be prevented from being damaged by water and gas during the grinding and cleaning process.

As shown in the portion P8 of FIG. 17, in the method of yet another variant embodiment of the present embodiment, after the light conversion element 106 is formed, a filling layer 1668 may be filled into the opening OP of the partition wall 104. Then, a planarization 1670 may be formed on the partition wall 104 and the filling layer 1668, so as to flatten the surface. Because the filling layer 1668 of the present variant embodiment is formed by inkjet printing process, the opening OP may be filled well. Through this method, because the filling layer 1668 may be filled into the opening OP effectively, the air produced between the light conversion element 106 or the light scattering layer 116 and the filling layer 1668 may be reduced, thereby avoiding mismatch between the refractive index of air and the refractive index of the filling layer 1668.

In summary, the overflow of the light conversion ink in the light emitting device of the present disclosure may be reduced by increasing the thickness of the partition wall, or the problem of color mixing in the same opening may also be solved. Furthermore, in the method of manufacturing the light emitting device of the present disclosure, by repeating the steps of coating, baking, patterning and baking, the partition wall with enough thickness and uniform thickness may be formed.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A light emitting device, comprising:
   a substrate;
   a plurality of light emitting elements disposed on the substrate;
   a partition wall disposed on the substrate, the partition wall defining a plurality of cavities, and one of the plurality of cavities corresponding to one of the plurality of light emitting elements;
   a light conversion element disposed in the one of the plurality of cavities;
   an encapsulation layer disposed on the plurality of light emitting elements;
   an intermediate layer disposed between the light conversion element and the one of the plurality of light emitting elements; and
   a protection layer disposed between the intermediate layer and the plurality of light emitting elements,
   wherein the encapsulation layer is disposed between the intermediate layer and the light conversion element,
   wherein the encapsulation layer is in contact with a sidewall of the partition wall.

2. The light emitting device according to claim 1, wherein at least a portion of the partition wall in a cross-section view is arc-shaped.

3. The light emitting device according to claim 1, further comprising a light blocking layer disposed on the partition wall.

4. The light emitting device according to claim 1, wherein the partition wall has a top surface higher than a top surface of the light conversion element in at least a part of the one of the plurality of cavities.

5. The light emitting device according to claim 1, wherein the partition wall has a thickness ranging from 4 micrometers to 30 micrometers in at least a part of the one of the plurality of cavities.

6. The light emitting device of claim 1, wherein the partition wall is a multi-layer structure.

7. The light emitting device of claim 6, wherein the multi-layer structure comprises a first sub-layer and a second sub-layer on the first sub-layer.

8. The light emitting device according to claim 7, wherein a thickness of the first sub-layer is less than a thickness of the second sub-layer.

9. The light emitting device of claim 7, wherein the first sub-layer and the second sub-layer are formed in different steps.

10. The light emitting device according to claim 7, wherein the first sub-layer comprises a first sidewall, the second sub-layer comprises a second sidewall, and a taper angle of the first sidewall relative to the substrate is less than a taper angle of the second sidewall relative to the substrate.

11. The light emitting device of claim 7, wherein a concentration of fluorine in the first sub-layer is different from a concentration of fluorine in the second sub-layer.

12. The light emitting device of claim 7, wherein a bottom width of the first sub-layer is greater than a bottom width of the second sub-layer.

13. The light emitting device of claim 1, wherein the light conversion element comprises a phosphor material, a fluorescent material, or quantum dot particles.

14. The light emitting device of claim 1, further comprising a pixel defining layer comprising a plurality of first openings, wherein the partition wall comprising a plurality of second openings, and one of the plurality of first openings corresponds to one of the plurality of second openings.

15. The light emitting device of claim 1, wherein the encapsulation layer comprises a curved surface adjacent to the light conversion element.

16. The light emitting device of claim 1, wherein a surface of the light conversion element facing the encapsulation layer is arc-shaped.

* * * * *